United States Patent
Chan et al.

(10) Patent No.: US 8,194,230 B2
(45) Date of Patent: Jun. 5, 2012

(54) PROJECTION OBJECTIVES HAVING MIRROR ELEMENTS WITH REFLECTIVE COATINGS

(75) Inventors: Danny Chan, Schwaebisch Gmuend (DE); Hans-Juergen Mann, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 833 days.

(21) Appl. No.: 11/949,376

(22) Filed: Dec. 3, 2007

(65) Prior Publication Data
US 2008/0165415 A1 Jul. 10, 2008

Related U.S. Application Data

(60) Provisional application No. 60/872,503, filed on Dec. 4, 2006.

(30) Foreign Application Priority Data

Dec. 4, 2006 (EP) .................................... 06025020

(51) Int. Cl.
| | |
|---|---|
| *G03B 27/00* | (2006.01) |
| *G03B 27/42* | (2006.01) |
| *G03B 27/70* | (2006.01) |
| *G03B 27/52* | (2006.01) |
| *G02B 5/08* | (2006.01) |

(52) U.S. Cl. ............... 355/57; 355/53; 355/43; 355/55; 359/351; 359/861

(58) Field of Classification Search .................... 355/53, 355/67, 43, 39, 57, 55; 359/351, 861
See application file for complete search history.

(56) References Cited

U.S. PATENT DOCUMENTS

| | | |
|---|---|---|
| 5,153,898 A | 10/1992 | Suzuki et al. |
| 5,911,858 A | 6/1999 | Ruffner |
| 5,973,826 A | 10/1999 | Chapman et al. |
| 6,000,798 A | 12/1999 | Chipman et al. |

(Continued)

FOREIGN PATENT DOCUMENTS

EP 1 281 011 2/2003
(Continued)

OTHER PUBLICATIONS

Machine translation of JP2006-059889.*
(Continued)

*Primary Examiner* — Edward Glick
*Assistant Examiner* — Deoram Persaud
(74) *Attorney, Agent, or Firm* — Fish & Richardson P.C.

(57) ABSTRACT

An optical system has a plurality of elements arranged to image radiation at a wavelength λ from an object surface to an image surface, the elements include mirror elements having a reflective surface positioned at a path of radiation. At least one of the mirror elements is a pupil mirror having a pupil mirror surface arranged at or near to a pupil surface of the optical system. At least one of the remaining mirror elements is a highly loaded mirror having a mirror surface arranged at a position where at least one of a largest value of a range of angles of incidence and a largest value of an average angle incidence of all remaining mirrors occurs, where the remaining mirrors include all mirrors except for the pupil mirror. The pupil mirror surface is formed by a reflective coating designed as a one-dimensionally graded coating including a multilayer stack of layers of different materials, the layers having a geometrical layer thickness which varies according to a first grading function in a first direction of the coating and which is substantially constant in a second direction perpendicular to the first direction. The mirror surface of the highly loaded mirror is coated with a reflective mirror coating designed as a graded coating according to a second grading function.

48 Claims, 11 Drawing Sheets

U.S. PATENT DOCUMENTS

| | | | |
|---|---|---|---|
| 6,014,252 | A | 1/2000 | Shafer |
| 6,226,346 | B1 | 5/2001 | Hudyma |
| 6,262,826 | B1 | 7/2001 | Shafer |
| 6,522,716 | B1 * | 2/2003 | Murakami et al. ............... 378/34 |
| 6,927,901 | B2 | 8/2005 | Mann et al. |
| 7,414,781 | B2 | 8/2008 | Mann et al. |
| 2002/0057421 | A1 * | 5/2002 | Kurematsu et al. ............. 353/74 |
| 2002/0129328 | A1 | 9/2002 | Komatsuda |
| 2003/0099034 | A1 * | 5/2003 | Mann et al. ................... 359/359 |
| 2007/0132977 | A1 * | 6/2007 | Komatsuda .................... 355/60 |

FOREIGN PATENT DOCUMENTS

| | | |
|---|---|---|
| JP | 2006059889 | 3/2006 |
| WO | WO 99/42902 A2 | 8/1999 |
| WO | WO 99/42905 A1 | 8/1999 |
| WO | WO 01/88597 | 11/2001 |
| WO | WO 02/073064 | 9/2002 |
| WO | WO 2005/098487 A1 | 10/2005 |
| WO | WO 2005/119369 A1 | 12/2005 |
| WO | WO 2007/031271 | 3/2007 |

OTHER PUBLICATIONS

Yulin et al., "EUV/Soft X-Ray Multilayer Optics," Proceedings of SPIE vol. 5645, pp. 289-298, (2005).

Bal, Matthieu Frederic, dissertation "Next-Generation Extreme Ultraviolet Lithographic Projection Systems", pp. 1-139, (Feb. 10, 2003).

* cited by examiner

PROJECTION OBJECTIVES HAVING MIRROR ELEMENTS WITH REFLECTIVE COATINGS

CROSS-REFERENCE TO RELATED APPLICATIONS

This application claims priority under 35 U.S.C. §119 to European patent application serial number 06025020.6, filed Dec. 4, 2006. This application also claims priority under 35 U.S.C. §119(e)(1) to U.S. patent application Ser. No. 60/872,503 filed Dec. 4, 2006. These applications are incorporated by reference herein.

FIELD

This disclosure relates to optical systems having mirror elements with reflective coatings for use with short wavelength radiation in photolithography equipment, as well as related systems, components and methods. Such optical systems can be employed as projection objectives in projection exposure systems used to fabricate semiconductor devices and other types of microdevices and serve to project patterns on photomasks (or reticles) onto an object having a photosensitive coating at ultrahigh resolution.

BACKGROUND

In order to allow creating even finer structures, various approaches to improving the resolving power of projection objectives are being pursued. It is well known that resolving power may be improved by increasing the image-side numerical aperture (NA) of the projection objective. Another approach is employing shorter-wavelength electromagnetic radiation.

SUMMARY

In one aspect, the disclosure provides an optical system that includes a plurality of elements arranged to image radiation at a wavelength $\lambda$ from an object surface to an image surface. The elements include mirror elements, and each mirror element has a reflective surface positioned at a path of the radiation. At least one first mirror element of the plurality of mirror elements is a pupil mirror having a pupil mirror surface arranged at or near to a pupil surface of the optical system. At least one second mirror element of the plurality of mirror elements is a highly loaded mirror having a mirror surface arranged at a position where at least one of a largest value of a range of angles of incidence and a largest value of an average angle incidence of all remaining mirrors occurs. The at least one second mirror element is different from the at least one first mirror element. The pupil mirror surface is formed by a reflective coating designed as a one-dimensionally graded coating including a multilayer stack of layers of different materials. The layers have a geometrical layer thickness which varies according to a first grading function in a first direction of the coating and which is substantially constant in a second direction perpendicular to the first direction. The mirror surface of the highly loaded mirror is coated with a reflective mirror coating designed as a graded coating according to a second grading function.

In another aspect, the disclosure provides a projection-exposure system configured to be used in microlithography. The system includes an illumination system configured to receive radiation from a primary light source and to illuminate a pattern in an object surface of a projection objective. The system also includes a projection objective that includes the optical system described in the preceding paragraph.

In a further aspect, the disclosure provides a method that includes illuminating a mask having a pattern with radiation having a wavelength $\lambda$. The method also includes using an optical system as described herein to project an image of the pattern onto a photosensitive substrate arranged in the vicinity of the image plane of a projection objective formed.

In an additional aspect, the disclosure provides an optical system that includes a plurality of elements arranged to image radiation at a wavelength $\lambda$ from an object surface to an image surface. The elements include mirror elements having a reflective surface positioned at a path of radiation. At least one of the mirror elements is a pupil mirror having a pupil mirror surface arranged at or near to a pupil surface of the optical system. The pupil mirror surface is formed by a reflective coating designed as a one-dimensionally graded coating including a multilayer stack of layers of different materials. The layers have a geometrical layer thickness which varies according to a first grading function in a first direction of the coating and which is substantially constant in a second direction perpendicular to the first direction.

In another aspect, the disclosure provides an optical system that includes a plurality of elements arranged to image radiation at a wavelength $\lambda$ from an object surface to an image surface. The elements include mirror elements having a reflective surface positioned at a path of radiation. At least one first mirror element of the plurality of mirror elements is a pupil mirror having a pupil mirror surface arranged at or near to a pupil surface of the optical system. At least one second mirror element of the plurality of mirror elements being a highly loaded mirror. The at least one second mirror is different from the at least one first mirror element. The pupil mirror surface is formed by a reflective coating designed as a one-dimensionally graded coating including a multilayer stack of layers of different materials. The layers have a geometrical layer thickness which varies according to a first grading function in a first direction of the coating and which is substantially constant in a second direction perpendicular to the first direction. The mirror surface of the highly loaded mirror is coated with a reflective mirror coating designed as a graded coating according to a second grading function.

In a further aspect, the disclosure provides an optical system that includes a plurality of elements arranged to image radiation at a wavelength $\lambda$ from an object surface to an image surface. The elements include mirror elements having a reflective surface positioned at a path of radiation. The mirror elements include a mirror element having a maximum value for the range of the angles of incidence, $\Delta\Theta$, in a first direction, this mirror element is coated with a reflective coating designed as a one-dimensionally graded multilayer coating including a multilayer stack of layers of different materials. The layers have a geometrical layer thickness which varies according to a first grading function in a first direction of the coating and which is substantially constant in a second direction perpendicular to the first direction.

In an additional aspect, the disclosure provides an optical system that includes a plurality of elements arranged to image radiation at a wavelength $\lambda$ from an object surface to an image surface. The elements include mirror elements having a reflective surface positioned at a path of radiation. The mirror elements include a mirror element having a maximum value for a variation, $\Delta\Theta_{avg}$, of an average angle of incidence. This mirror element is coated with a reflective coating designed as a one-dimensionally graded multilayer coating including a multilayer stack of layers of different materials. The layers have a geometrical layer thickness which varies according to a first grading function in a first direction of the coating and which is substantially constant in a second direction perpendicular to the first direction.

In another aspect, the disclosure provides an optical system that includes a plurality of elements arranged to image radiation at a wavelength λ from an object surface to an image surface. The elements include mirror elements having a reflective surface positioned at a path of radiation. The mirror elements include a first pupil mirror positioned at or close to a first pupil surface and a second pupil mirror positioned at or close to a second pupil surface optically conjugate to the first pupil surface. The first and second pupil mirror each have a reflective coating designed as a graded coating having a geometrical layer thickness which varies according to a grading function in at least one direction of the mirror coating.

In an additional aspect, the disclosure provides an optical system that includes a plurality of elements arranged to image radiation at a wavelength λ from an object surface to an image surface. The elements include mirror elements having a reflective surface positioned at a path of radiation. The optical system includes at least one reflective freeform surface and at least one reflective surface is coated with a graded coating having a geometrical layer thickness which varies according to a grading function in at least one direction of the mirror coating.

In another aspect, the disclosure provides an optical system that includes a plurality of elements arranged to image radiation at a wavelength λ from an object surface to an image surface. The elements include mirror elements having a reflective surface positioned at a path of radiation. The optical system includes at least three mirrors and is designed for EUV wavelength 2 nm<λ<20 nm and has an image-side numerical aperture NA>0.25, where an overall transmission T is 0.08 or more.

In some embodiments, the disclosure provides an EUV projection optical system operable at high numerical aperture having relatively large transmission, providing higher wafer throughput than conventional systems.

In certain embodiments, the disclosure provides EUV projection objectives having relatively small variations of reflectivity of mirror elements positioned at positions where relatively large variations of angles of incidence for rays occur, which can result in higher and more uniform reflectivities of mirror elements.

In some embodiments, the disclosure provides EUV projection objectives having mirror elements arranged in a non-rotationally symmetric arrangement and reflective coatings therefore providing a high overall transmission and a uniform distribution of radiation intensity in the image field.

In certain embodiments, the disclosure an optical system that includes a plurality of elements arranged to image radiation at a wavelength λ from an object surface to an image surface. The elements include mirror elements having a reflective surface positioned at a path of radiation. At least one of the mirror elements is a pupil mirror having a pupil mirror surface arranged at or near to a pupil surface of the optical system. At least one of the remaining mirror elements being a highly loaded mirror having a mirror surface arranged at a position where at least one of a largest value of a range of angles of incidence and a largest value of an average angle incidence of all remaining mirrors occurs. The remaining mirrors include all mirrors except for the pupil mirror. The pupil mirror surface is formed by a reflective coating designed as a one-dimensionally graded coating including a multilayer stack of layers of different materials. The layers have a geometrical layer thickness which varies according to a first grading function in a first direction of the coating and which is substantially constant in a second direction perpendicular to the first direction; and wherein the mirror surface of the highly loaded mirror is coated with a reflective mirror coating designed as a graded coating according to a second grading function.

At least two mirror elements can be positioned at preselected positions along the path of radiation through the optical system have reflective coatings designed as "graded coating". As used herein, the term "graded coating" denotes a reflective coating where a geometrical thickness of some or all layers of the coating varies substantially across the surface of the mirror. The local variation of layer thickness in such coatings having non-uniform layer thickness may be described by a grading function. The one-dimensionally graded coating may be described as a coating having a geometrical layer thickness which varies according to a first grading function in a first direction of the coating and is substantially constant in a second direction perpendicular to the first direction in a Cartesian coordinate system. Such coatings may also be described as being substantially translation invariant in the second direction. The one-dimensionally graded coating of the pupil mirror may be designed such that the non-uniformity of layer thickness accounts for a variation of local angles of incidence of radiation incident on the pupil mirror such that a high percentage of radiation energy incident on the mirror is reflected therefrom at each location of the mirror surface illuminated by the radiation. Therefore, the one-dimensionally graded coating of the pupil mirror may be optimized in terms of reflectivity to avoid or minimize apodization at the pupil surface.

It has been found that further improvements of overall transmission and uniformity of image field intensity may be obtained by supplying at least a second graded coating on an additional mirror which is subject to relatively high angular load. The term "angular load" in this context means that such highly loaded mirror may have the largest range of angles of incidence and/or the highest value of an average angle incidence of all remaining mirrors, where the remaining mirrors include all mirrors except for the pupil mirror having the one-dimensionally graded coating. In combination, the pupil mirror being coated with a one-dimensionally graded coating and the highly loaded mirror coated with a graded coating of appropriate design allow to increase the overall transmission of the projection objective while, at the same time, a high level of uniformity of illumination in the image field is obtained.

In some embodiments, at least one of the position and a variation of geometric film thickness of layers of the mirror coating of the highly loaded mirror is adapted to the one-dimensionally graded pupil mirror coating such that non-uniformities of radiation intensity in the image field caused by the one-dimensionally graded pupil mirror coating are at least partly compensated by the graded coating of the highly loaded.

Since mirror elements positioned optically close to or at a pupil surface are typically subject to relatively large variations of the angles of incidence, significant improvements of reflectivity relative to conventional systems may be obtained by supplying a pupil mirror with a one-dimensionally graded coating. Further, obtaining a relatively uniform illumination intensity in the image field has been found to be most effective where the highly loaded mirror is optically close to or at a field surface. In some embodiments the pupil mirror surface is arranged at a position where the condition P(M)≧0.95 is fulfilled and the mirror surface of the highly loaded mirror is arranged at a position where the condition P(M)<0.95 is fulfilled, wherein $$P(M)=D(SA)/(D(SA)+D(CR)),$$

where D(SA) is a diameter of a subaperture of a ray bundle originating from a field point in the object surface on a respective surface M; and D(CR) is a maximum distance of chief rays of an effective object field imaged by the optical system measured in a reference plane of the optical system on the surface M. The reference plane may be a symmetry plane of the optical system. In systems having a meridional plane, the reference plane may be the meridional plane.

As the diameter of a subaperture approaches zero at a field surface, the parameter P(M)=0 in a field surface. In contrast, the maximum distance of chief rays, D(CR), approaches zero in pupil surface.

Where the condition $1 \geq P(M) \geq 0.95$ is fulfilled, the pupil mirror is very close or at a pupil surface, making the optically effect of the one-dimensionally graded coating with regard to uniformity of reflectivity strong. In some embodiments, P(M) $\geq 0.98$ at the pupil mirror. Where the condition $0 \leq P(M)<0.95$ is fulfilled for the other, highly loaded mirror, the influence towards obtaining a uniform field intensity may be strong.

In some embodiments, a highly loaded mirror provided in addition to the pupil mirror is another pupil mirror positioned at or close to another pupil surface of the projection objective. In that case, the graded coating of this highly loaded mirror may be optimized to compensate at least partially for illumination inhomogeneities caused by the one-dimensionally graded coating of the other pupil mirror. Those embodiments may also be characterized as having a first pupil mirror positioned at or close to a first pupil surface and a second pupil mirror positioned at or close to a second pupil surface optically conjugate to the first pupil surface, where the first and second pupil mirror each have a reflective coating designed as a graded coating having a geometrical layer thickness which varies according to a grading function in at least one direction of the mirror coating.

There may be more than one mirror with a graded coating in addition to the pupil mirror, such as two additional mirrors or more. One of that additional mirrors may be positioned optically close to a field surface whereas another additional mirror may be positioned optically close to a pupil surface.

Typically, at least one mirror has a coating with uniform thickness, often there are two or three or four or more mirrors with a uniform coating. Some embodiments have only two mirrors with a graded coating, such that all remaining mirrors have a coating with uniform thickness. A cost effective manufacturing of the entire system is possible where graded coatings are applied only to selected mirrors, whereas the remaining mirrors have a uniformly thick coating.

In general, a graded coating may be useful wherever a mirror is subject to relatively high average angles of incidence and/or relatively high ranges of angles of incidence. In any case the graded coating may be designed such that the reflectivity of that mirror becomes more homogeneous when compared with a uniform coating. Also, where the mirror is positioned at or optically close to a field surface, a positive influence on field uniformity may be obtained. On the other hand, if the mirror is arranged at or close to a pupil surface, an improvement with regard to pupil apodization may be obtained.

It has been observed that in most cases the reflectivity properties of a highly loaded mirror may be improved by applying a graded coating. Generally, there may be an interplay between the bandwidth of the mean angles of incidence and the absolute values of the angles of incidence. A graded coating may be most effective were a large bandwidth of incidence angles occurs. The bandwidth (range of angles of incidence) becomes more critical the larger the absolute values of the incidence angles become. For example, a bandwidth which is relatively uncritical at low absolute values of angles of incidence (such as less than 10° or less than 5° may be unacceptable at larger absolute values of angles of incidence, such as values of 20° or more. Bearing these conditions in mind, it may be useful if a highly loaded mirror, as defined above, is coated with a graded coating in addition to the one-dimensionally graded coating of the pupil mirror. Where relatively lower values of mirror reflectance and/or homogeneity of the reflectance are acceptable, it may be sufficient if the pupil mirror surface is coated with a one-dimensionally graded coating, as mentioned above, and all other mirrors are coated with coatings having essentially uniform thickness.

Therefore, the disclosure also relates to an optical system comprising: a plurality of elements arranged to image radiation at a wavelength λ from an object surface to an image surface, the elements including mirror elements having a reflective surface positioned at a path of radiation; at least one of the mirror elements being a pupil mirror having a pupil mirror surface arranged at or near to a pupil surface of the optical system; and wherein the pupil mirror surface is formed by a reflective coating designed as a one-dimensionally graded coating including a multilayer stack of layers of different materials, the layers having a geometrical layer thickness which varies according to a first grading function in a first direction of the coating and which is substantially constant in a second direction perpendicular to the first direction In some cases, the improvements with respect to overall transmission and/or homogeneity of the illumination in the image field may be obtained if, in addition to a one-dimensionally graded coating on a pupil mirror, at least one additional mirror will have a graded coating, where that additional mirror may not be the remaining mirror element having the largest value of a range of angles of incidence and/or a largest value of an average angle of incidence of all remaining mirrors.

Therefore, the disclosure also relates to an optical system comprising: a plurality of elements arranged to image radiation at a wavelength λ from an object surface to an image surface, the elements including mirror elements having a reflective surface position at a path of radiation; at least one of the mirror elements being a pupil mirror having a pupil mirror surface arranged at or near to a pupil surface of the optical system; and at least one of the remaining mirror elements being a highly loaded mirror, where the remaining mirrors include all mirrors except for the pupil mirror; wherein the pupil mirror surface is formed by a reflective coating designed as a one-dimensionally graded coating including a multilayer stack of layers of different materials, the layers having a geometrical layer thickness which varies according to a first grading function in a first direction of the coating and which is substantially constant in a second direction perpendicular to the first direction; and wherein the mirror surface of the highly loaded mirror is coated with a reflective mirror coating designed as a graded coating according to a second grading function.

The variation of layer thickness in the one-dimensionally graded coating of the pupil mirror may be optimized or described in various ways. Typically, a path of radiation through the optical system may be characterized by local angles of incidence, Θ, of rays on each reflecting surface and/or by a range of angles of incidence, ΔΘ, of rays on each reflective surface for a selected location on that surface (i.e. $\Delta\Theta$ depends on x and y coordinate of location). The path of radiation may also be characterized by the average angles of incidence, $\Theta_{avg}$, of rays on each reflective surface and/or by the variation, $\Delta\Theta_{avg}$, of the average angle of incidence across a mirror surface.

In some embodiments the first grading function is adapted to the angles of incidence at the pupil mirror surface such that a local geometrical layer thickness, d(x, y), of the layers of the multilayer stack varies substantially proportional to the average (or mean) angle of incidence, $\Theta_{avg}$, in the first direction.

In many cases, the dependence of the optimal layer thickness (or bilayer thickness) on the average angle of incidence may be given in good approximation by the Bragg condition: $n\lambda=2d \cos(\Theta_{avg})$, where n is an integer number, $\lambda$ is the wavelength of the incident radiation, d is the bilayer thickness, and $\Theta_{avg}$ is the mean angle of incidence, measured with respect to the local surface normal. Generally in accordance with the Bragg condition, larger local geometrical layer thicknesses are provided at locations with larger average angles of incidence, whereas smaller geometrical layer thicknesses are provided where the average incidence direction is closer to the local surface normal.

The first grading function may be adapted to the average angles of incidence, $\Theta_{avg}$, at the pupil surface such that an optical layer thickness of the layers of the multilayer stack is substantially constant in the first direction. As opposed to the geometrical layer thickness, the optical layer thickness describes the optical effect of layers in a multilayer stack and considers the refractive index as well as the geometrical layer thickness of the layers.

In some embodiments the first grading function is adapted to the variation $\Delta\Theta_{avg}$ of mean (or average) angles of incidence at the pupil mirror surface such that an absolute value of a local reflectivity of the pupil mirror surface varies by no more than 30% or no more than 20% in both the first and the second direction.

In some embodiments it has been found that the local angles of incidence on mirrors near or at a pupil surface increases from one side to the other side of the utilized mirror area in a reference plane, such as in the meridional plane.

Specifically for those embodiments it has been found useful when the first grading function is defined such that the local geometric layer thickness of the layers of the multilayer increases monotonically from one side of the pupil mirror to an opposite side of the pupil mirror along the first direction. In some embodiments the first grading function is a linear function. In this specification, those embodiments may also be termed as a "tilted coating". In some embodiments it has been found useful if the first grading function is a parabolic function, wherein the rate of change of layer thickness between opposite edges of the utilized pupil mirror surface varies (decreases or increases continually) in the first direction.

The second grading function of the reflective coating on the highly loaded mirror may be optimized in various ways. In some embodiments, that coating is designed according to a rotationally symmetric second grading function symmetric to a rotation centre. In some embodiments, the rotationally symmetric second function is a parabolic function such that the highly loaded mirror carries a rotationally symmetric, parabolic coating. The rotation center may be positioned on a reference axis or decentered thereto. The rotation center may be positioned centrically or acentrically on the mirror substrate, which may be positioned outside the reference axis.

The layer thickness profiles of graded coatings may be described as a variation of layer thickness relative to a local position (x,y) on a mirror surface. At each location, the layer thickness will be measured along the surface normal, i.e. perpendicular to a tangent to the mirror surface at the respective location. The real (geometrical) layer thickness d(x,y) may then be described as a product of a nominal thickness, d0, and a modification factor fac(x, y), which depends on the location.

In some embodiments the local geometrical film thickness d(x, y) of the layers of the multilayer stack deviates by $\lambda/100$ or less (or $\lambda/1000$ or less) from a grading function according to $$d(x,y)=d0 \cdot \max(0, \mathrm{fac}(x,y)) \quad (1),$$

where $$\mathrm{fac}(x,y)=c0+c1y \cdot y + c2 \cdot r(x,y)^2 \quad (2),$$

wherein $r(x,y)=\sqrt{x^2+y^2}$, where y is a coordinate in the first direction, x is a coordinate in the second direction, d0 is a nominal thickness measured in a z direction normal to the reflective surface perpendicular to the x and y direction in a local coordinate system of the reflective surface. Introducing the max ( ) function prevents the function d(x, y) from attaining values smaller then zero. In this polynomial expression for fac(x, y) the grading profile may be understood as a superposition of a constant value (c0), and a "tilting" of the coating in y-direction (corresponding to a linear variation of layer thickness in the direction in the meridional plane) and a rotational symmetric parabolic term. Therefore, in a grading according to a linear grading function (tilted coatings), the term c1y deviates from 0 and the parabolic constant c2=0. In a parabolic coating, c1y=0 and c2≠0. Mixed graded coatings with c1y≠0 and c2≠0 are possible, for example in cases where a local distribution of angles of incidence across a mirror surface deviates significantly from an essentially one-dimensional variation, as found in an "tilted coating".

In mirrors designed for reflecting EUV radiation a reflective coating is typically formed by a stack of so-called bilayers, where a bilayer includes a relatively thick layer of a first material (such as silicon) having a first refractive index and a relatively thin second layer of a second material (such as molybdenum) having a second refractive index which is higher than the first refractive index. In general, a thickness ratio ($\gamma$ factor) between the thicknesses of the first layer and second layer should be maintained essentially constant in such bilayer although the absolute thickness of the bilayer may vary across the mirror surface in a graded coating. In cases where such bilayers are used, the above condition also applies for the geometrical thickness d(x,y) of the bilayer.

Absolute values for parameters c0, c1y and c2 may vary depending on the design of the optical system. Specifically, those parameters will vary depending on the numerical aperture NA of the projection objective which also determines the angles of incidence and related properties of the rays passing through the optical system. In some embodiments, the condition $0.90 \leq c0 \leq 1.2$ or the condition $0.95 \leq c0 \leq 1.05$ applies (e.g., $0.98 \leq c0 \leq 1.02$). In some embodiments the amount of the parameter c1y may be 0.1 or less, for example 0.01 or less. Sometimes, the condition $0.001 \leq c1y \leq 0.002$ applies. In some embodiments, the amount of parameter c2 is $10^{-5}$ or less, such as $10^{-6}$ or less. The amount of parameter c2 may be $10^{-8}$ or more, such as $10^{-7}$ or more.

These values apply for a nominal thickness d0=6.9 nm and allow to calculate the real physical thickness of the graded coating according to the respective grading function. If a different nominal thickness d0 were used, the same physical thickness of the graded coating would be obtained with a different set of values for the parameters cx, c1y and c2.

Therefore, also conversions based on different values for d0 shall be covered by these exemplary parameter values.

The modulation factor fac(x, y) is defined in a local coordinate system of the mirror. The origin of the local coordinate system may or may not coincide with a reference axis of the optical system, i.e. it may be centred or decentred with respect to that reference axis. The reference axis may coincide with an optical axis of the optical system. However, systems having no optical axis may also be utilized.

According to another formulation of the disclosure, the mirror elements include a mirror element having a maximum value for the range of angles of incidence, $\Delta\Theta$, wherein that mirror is coated with a reflective coating designed as a one-dimensionally graded multilayer coating. Typically, such mirror element may be positioned at or close to a pupil surface.

Alternatively, or in addition, the mirror elements may include a mirror element having a maximum value for an average angle of incidence, $\Theta_{avg}$, wherein that mirror element is coated with a reflective coating designed as a one-dimensionally graded multilayer coating.

In some embodiments, all curved mirror elements (concave or convex) have a rotationally symmetric reflective surface. Some or all rotationally symmetric reflective surfaces may be spherical surfaces. Also, some or all rotationally symmetric reflective surfaces may be aspherical surfaces.

As described earlier, graded coatings may be utilized to decrease a local variation of reflectivity of mirrors placed at positions where a relatively large range of angles of incidence and/or large values for an average angle of incidence occur. However, as a trade-off, graded coatings may introduce perturbations, such as an inhomogeneity of phases, which may be difficult to compensate with other optical elements of the optical system. This applies particularly to non-rotational symmetric coatings, such as the one-dimensionally graded coatings described above. It has been found that an improvement of the overall performance may be obtained if at least one of the elements is a reflective element that has a rotationally asymmetric surface positioned in a path of radiation, wherein the rotationally asymmetric surface deviates from a best-fit rotationally symmetric surface by about $\lambda$ or more at one or more locations. Reflective elements having reflective surfaces according to this conditions will be denoted "freeform surfaces" in this application. Utilizing at least one freeform surface within the optical system provides additional free parameters to compensate for problems caused by utilizing graded reflective coatings. Also, freeform surfaces may be shaped and positioned such that only relatively small local angles of incidence, $\Theta$, and/or relatively small ranges of angles of incidence, $\Delta\Theta$, of rays and/or relatively small average angles of incidence, $\Theta_{avg}$, on each reflective surface for a selected section of the optical system are obtained, thereby reducing the above mentioned problems typically associated with higher incidence angles.

Unlike spherical or rotationally symmetric aspherical mirrors, freeform mirror surfaces do not have an axis of rotational symmetry. Whereas a rotationally symmetric surface (spherical or aspheric) may be described mathematically using a rotationally symmetric function having only one variable, namely a radial distance from an axis of rotational symmetry, a function defining a freeform surface requires using at least two independent variables.

Generally, a freeform surface deviates from a best fit rotationally symmetric surface (e.g., a spherical or aspherical surface). A local deviation of a freeform surface from a best fit surface (spherical or aspherical) with rotational symmetry is significantly larger than deviations typically introduced by a manufacturing process. While those maximum deviations introduced by manufacturing (manufacturing tolerances) may be in the order of $\lambda/50$ or $\lambda/100$ or less, for example, a freeform surface can, for example, have a maximum deviation from a best fit sphere or a best fit non-spherical conical surface of about $\lambda$ or more. Freeform surfaces may include, but are not limited to, biconic surfaces (with two different basic curvatures and two different conic constants in two orthogonal directions), toric or toroid surfaces, or anamorphic aspheric surfaces. A cylindrical surface may be denoted as a freeform surface. Some freeform surfaces may be mirror-symmetric relative to one or more mirror symmetry planes and/or some freeform surface may be described as a surface having an n-fold radial symmetry, with n being an integer $n \geqq 1$. A freeform surface may not have any symmetry axis and/or symmetry plane at all.

Various ways to describe optical surfaces, including anamorphic surfaces are disclosed, for example, in U.S. Pat. No. 6,000,798. Analytical formulas to describe rotationally asymmetric surfaces including anamorphic aspheric surfaces, toroidal surfaces or biconic aspherical surfaces are also disclosed in WO 01/88597. The partial disclosure of these document related to the mathematical description of optical surfaces is incorporated herein by reference. Some optical design and analysis software packages for optical design applications, such as OSLO® by Lambda Research Corp. of CODEV® by Optical Research Associates include mathematical functions allowing to design optical systems including rotationally asymmetric surfaces.

Definitions and descriptions of freeform surfaces and their use in optical systems for EUV lithography and other applications may be taken from applicant's provisional application Ser. No. 60/793,787 filed on Apr. 7, 2006, corresponding to WO 2007/031271 A1. The disclosure of that provisional application is incorporated herein by reference.

The mathematical descriptions mentioned above relate to mathematical surfaces. An optically used optical surface (i.e. the optically used area, meaning the physical surface that may intersect a ray) of an optical element described by such mathematical description generally includes a subset of surface points of the mathematical surface. With other words: the mathematical surface extends beyond a physical optical surface having a surface shape described by that mathematical surface. The physical edge of an optical element (surrounding the optically used area) may have any suitable symmetric or asymmetric shape. Where an optical system may be described as having a reference axis, some or all optically used areas (sections of the mathematical surfaces optically used to influence rays passing through an optical system) may be positioned outside the reference axis such that the reference axis intersects the mathematical surface, but does not intersect the optically used part of the mathematical surface.

The optical system may include at least one reflective freeform surface and at least one reflective surface may be coated with a graded coating. At least one reflective freeform surface may be coated with a graded coating. It is likewise possible to have the reflective freeform surface coated with a coating having a uniform thickness and another reflective surface, which may not be a freeform surface, is coated with the graded coating.

Therefore, according to another aspect of the disclosure, there is provided an optical system, comprising: a plurality of elements arranged to image radiation at a wavelength $\lambda$ from an object surface to an image surface, the elements including mirror elements having a reflective surface position at a path of radiation; wherein at least one of the elements is a reflective element that has a rotationally asymmetric surface positioned in the path of the radiation, wherein the rotationally asymmetric surface deviates from a best-fit rotationally symmetric surface by about λ or more at one or more locations; and wherein at least one reflective surface is formed by a reflective coating designed as a graded coating including a multilayer stack of layers of different materials, the layers having a geometrical layer thickness which varies according to a grading function.

The graded coating may be formed on a reflective element that has a rotationally asymmetric surface positioned in the path of the radiation.

The optical system may be a projection objective for EUV lithography.

Generally, as the image-side numerical aperture NA of the optical systems increases, the incidence angles of radiation on the mirrors also increase. The specific use of graded coatings on selected mirrors in the optical system may contribute to avoiding some of the drawbacks associated with large incidence angles and incidence angle variations.

According to another aspect of the disclosure, graded reflective coatings on selected reflective elements of the optical systems may be utilized to provide optical systems with image-side numerical apertures larger than conventional systems, while, at the same time, a high overall transmission (determined by the reflectivities of the mirrors) and low variation of intensity in the image field and/or a low level of pupil apodization are obtained. In some embodiments, the optical system has an image-side numerical aperture NA of about 0.25 or more. The image-side numerical aperture may be about 0.3 or more, or about 0.35 or more in EUV systems, for example NA=0.4. Despite the tendency for increased incidence angles on the mirror surfaces associated with the increase in numerical aperture, relatively large values for the overall transmission T of the optical system may be obtained. In some embodiments the optical system comprises at least three mirrors and is designed for EUV wavelength 13 nm<λ<14 nm and has an image-side numerical aperture NA>0.25, where the overall transmission T>0.08. The optical system may have six or more mirrors, for example exactly six mirrors. The condition NA>0.3 and/or NA≧0.35 and/or NA=0.4 may apply.

In some embodiments having three or more mirrors, an average reflectivity $R_{avg}$ for a wavelength bandpass between 13.36 nm and 13.64 nm integrated over the entire utilized area of the reflective mirror surface is at least 60% on each mirror. Those reflectivity values may be obtained with coatings having very smooth interfaces between different layers of a multilayer stack. Depending on the manufacturing method, a certain amount of the surface roughness may be caused at the interfaces between adjacent layers, thereby reducing the overall reflectivity of a multilayer stack. Therefore, a reflectivity value measured on a real mirror may be less than the reflectivity value calculated for that mirror based on mathematically smooth interfaces between the layers.

The previous and other properties can be seen not only in the claims but also in the description and the drawings, wherein individual characteristics may be used either alone or in sub-combinations as an embodiment of the disclosure and in other areas and may individually represent advantageous and patentable embodiments.

DETAILED DESCRIPTION

Embodiments of the disclosure are now described in more detail using as examples catoptric projection objectives which can be used in microlithography tools, e.g. in a projection exposure apparatus for manufacturing semiconductor devices.

Figure 1:
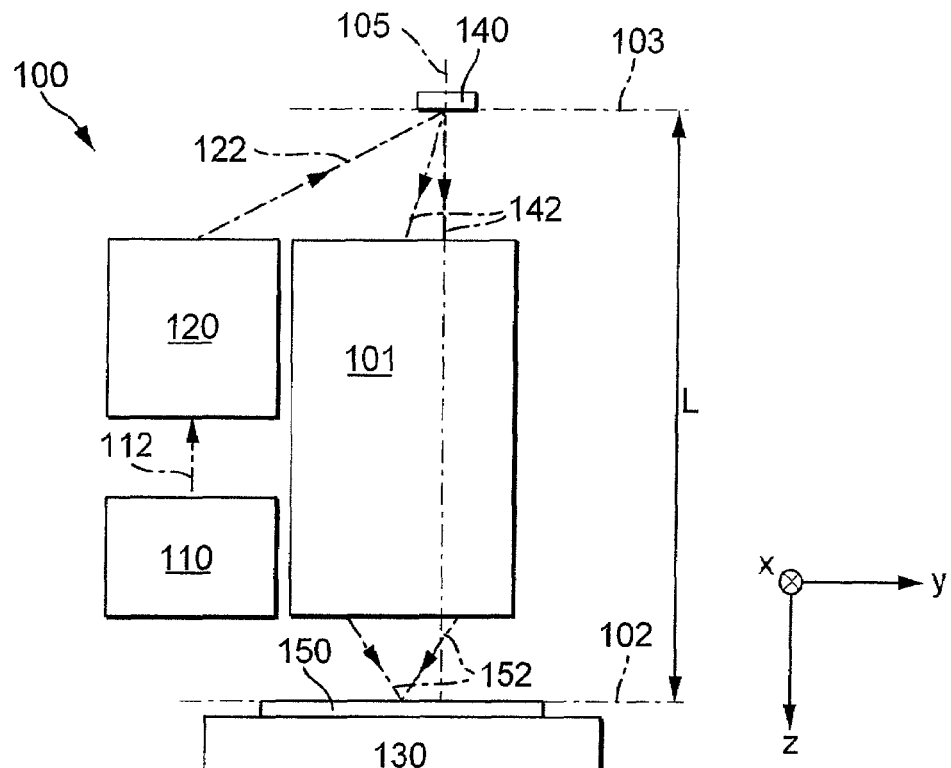
FIG. 1 is a schematic view of a microlithography tool.

Referring to FIG. 1, a microlithography tool 100 generally includes a light source 110, an illumination system 120, a projection objective 101, and a stage 130. A Cartesian coordinate system is shown for reference. Light source 110 produces radiation at a wavelength λ and directs a beam 112 of the radiation to illumination system 120. Illumination system 120 interacts with (e.g., expands and homogenizes) the radiation and directs a beam 122 of the radiation to a reticle 140 positioned at an object plane 103. Projection objective 101 images radiation 142 reflected from reticle 140 onto a surface of a substrate 150 positioned at an image plane 102. The radiation on the image-side of projection objective 101 is depicted as rays 152. As shown in FIG. 1, the rays are illustrative only and not intended to be accurately depict the path of the radiation with respect to reticle 140, for example. Substrate 150 is supported by stage 130, which moves substrate 150 relative to projection objective 101 so that projection objective 101 images reticle 140 to different portions of substrate 150.

Projection objective 101 includes a reference axis 105. In embodiments where projection objective is symmetric with respect to a meridional section, reference axis 105 is perpendicular to object plane 103 and lies inside the meridional section.

Light source 110 is selected to provide radiation at a desired operational wavelength, λ, of tool 100. Typically, for projection objectives designed for operation in lithography tools, wavelength λ is in the ultraviolet portion, the deep ultraviolet portion or the extreme ultraviolet portion of the electromagnetic spectrum. For example, λ can be about 200 nm or less. λ can be more than about 2 nm. Light source 110 can be an EUV light source providing radiation at an operational wavelength about λ=13.5 nm.

Illumination system 120 includes optical components arranged to form a collimated radiation beam with a homogeneous intensity profile. Illumination system 120 typically also includes beam steering optics to direct beam 122 to reticle 140. In some embodiments, illumination system 120 also include components to provide a desired polarization profile for the radiation beam.

Image plane 103 is separated from object plane 102 by a distance L, which is also referred to as the lengthwise dimension, or tracklength, of projection objective 101. In general, this distance depends on the specific design of projection objective 101 and the wavelength of operation of tool 100. In some embodiments, such as in tools designed for EUV lithography, L is in a range from about 1 m to about 3 m.

Figure 2:
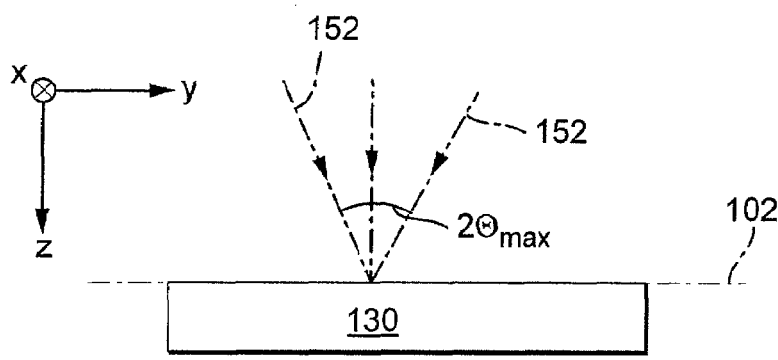
FIG. 2 is a schematic view showing a portion of the microlithography tool shown in FIG. 1.

As shown in FIG. 2, rays 152 define a cone of light paths that form the reticle image at image plane 102. The angle of the cone of rays is related to the image-side numerical aperture (NA) of projection objective 101. Image-side NA can be expressed as NA=$n_o \sin \Theta_{max}$, where $n_o$ refers to the refractive index of the medium adjacent the surface of substrate 150 (e.g., air, nitrogen, water or other immersion liquid, or evacuated environment), and $\Theta_{max}$ is the half-angle of the maximum cone of image forming rays from projection objective 101.

In general, projection objective 101 can have an image side NA of about 0.1 or more, e.g., about 0.15 or more, about 0.2 or more, about 0.25 or more, about 0.3 or more, about 0.35 or more.

The number of mirrors in projection objective 101 may vary. Typically, the number of mirrors is related to various performance trade-offs associated with the optical performance characteristics of the objective, such as the desired throughput (e.g., the intensity of radiation from the object that forms the image at image plane 102), the desired image-side NA and related image resolution, and the desired maximum pupil obscuration.

Embodiments for EUV applications typically have at least three or at least four mirrors. Exactly six mirrors may be desirable in some cases. Typically no more than six or no more than seven or no more than eight mirrors are used. In embodiments where it is desirable that all the mirrors of the objective are positioned between the object plane and the image plane, objective 101 will typically have an even number of mirrors. In certain embodiments, an odd number of mirrors can be used where all the mirrors of the projection objective are positioned between the object plane and image plane. For example, where one or more mirrors are tilted at relatively large angles, a projection objective can include an odd number of mirrors where all the mirrors are positioned between the object plane and image plane.

In some embodiments, at least one of the mirrors in projection objective 101 has a freeform surface. Unlike spherical or aspherical mirrors, freeform mirror surfaces do not have an axis of rotational symmetry. Generally, a freeform surface deviates from a best fit rotationally symmetric surface (e.g., a spherical or aspherical surface). Best fit surfaces are calculated by first calculating the surface area of the mirror surface and then determining a best fit to that surface of a spherical or aspherical surface using a least squares fitting algorithm. The best fit spherical or aspherical surface can be titled or decentered with respect to a reference axis, where decenter and tilt are used as additional fitting parameters. A freeform surface can, for example, have a maximum deviation from a best fit sphere of about λ or more.

In certain embodiments, freeform mirror surfaces can be described mathematically by the equation:

$$Z = \frac{cr^2}{1 + \sqrt{1 - (1+k)c^2r^2}} + \sum_{j=2}^{\alpha} C_j X^m Y^n \quad (3)$$

where $$j = \frac{(m+n)^2 + m + 3n}{2} + 1 \quad (4)$$

and Z is the sag of the surface parallel to a Z-axis (which may or may not be parallel to the z-axis in projection objective 101), c is a constant corresponding to the vertex curvature, k is a conic constant, and Cj is the coefficient of the monomial $X^m Y^n$. Parameter α is an integer indicating the order of the terms considered in the summation. A value α=66, for example, corresponds to a sum including the 10$^{th}$ order. Typically, the values of c, k, and $C_j$ are determined based on the desired optical properties of the mirror with respect to projection objective 101. Further, the order of the monomial, m+n, can vary as desired. Generally, a higher order monomial can provide a projection objective design with a higher level of aberration correction, however, higher order monomials are typically more computationally expensive to determine. In some embodiments, m+n is 10 or more (e.g., 15 or more, 20 or more). The parameters for the freeform mirror equation can be determined using commercially-available optical design software. In some embodiments, m+n is less than 10 (e.g., 9 or less, 8 or less, 7 or less, 6 or less, 5 or less, 4 or less, 3 or less).

Figure 3:
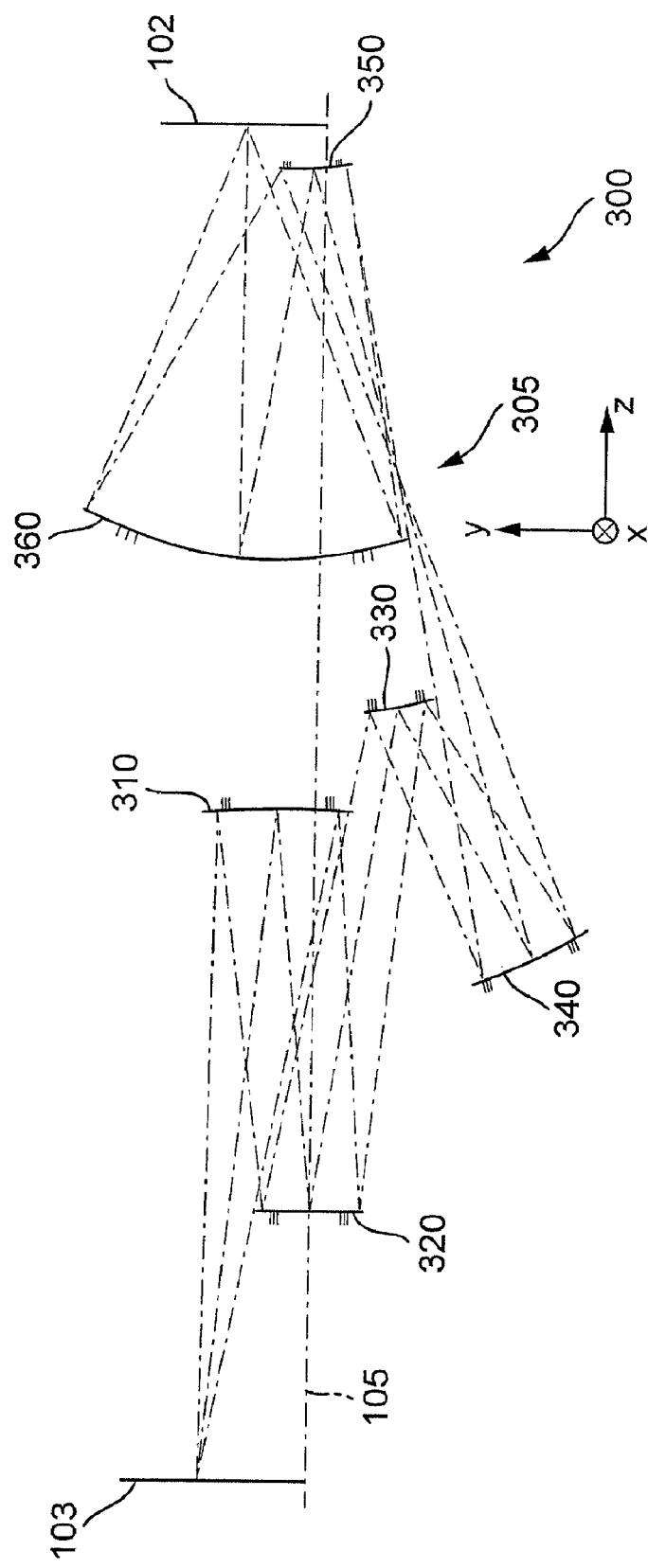
FIG. 3 is a cross-sectional view of a projection objective shown in meridional section.

An embodiment of a projection objective that includes six mirrors is shown in FIG. 3. Specifically, projection objective 300 includes six freeform mirrors 310, 320, 330, 340, 350, and 360. Data for projection objective 300 is presented in Table 3 and 3A. Table 1 presents optical data, while Table 3A presents freeform constants for each of the mirror surfaces. For the purposes of Table 3 and Table 3A, the mirror designations correlate as follows: mirror 1 (M1) corresponds to mirror 310; mirror 2 (M2) corresponds to mirror 320; mirror 3 (M3) corresponds to mirror 330; mirror 4 (M4) corresponds to mirror 340; mirror 5 (M5) corresponds to mirror 350; and mirror 6 (M6) corresponds to mirror 360. "Thickness" in Table 3 and subsequent tables refers to the distance between adjacent elements in the radiation path. The monomial coefficients, Cj, for the freeform mirrors, along with the amount the mirror is decentered and rotated from an initial projection objective design, are provided in Table 3A. R, the radius, is the inverse of the vertex curvature, c. Decenter is given in mm and rotation is given in degrees. Units for the monomial coefficients are mm$^{-j+1}$. Nradius is a dimensionless scaling factor (see, for example, the manual for CODE V®)

TABLE 3

| Surface | Radius | Thickness | Mode |
|---|---|---|---|
| Object | INFINITY | 719.154 | |
| Mirror 1 | −1768.086 | −427.871 | REFL |
| Mirror 2 | 2334.525 | 575.634 | REFL |
| Mirror 3 | 352.553 | −347.888 | REFL |
| Mirror 4 | 610.853 | 933.638 | REFL |
| Mirror 5 | 431.588 | −434.965 | REFL |
| Mirror 6 | 521.464 | 479.940 | REFL |
| Image | INFINITY | 0.000 | | curvature of 32 nm. Additional characteristics of projection objective 300 are presented in the discussion of projection objective 101 that follows.

The first mirror in the radiation path from object plane 103, concave mirror 310, has positive optical power. Mirrors 320, 340, and 360 are also concave P mirrors. Convex mirrors 330 and 350 have (N) negative optical power. The sequence of mirrors in the radiation path in projection objective 300 is thus PPNPNP.

For the mirrors in projection objective 300, the maximum deviation of the freeform surfaces from a best fit sphere for each mirror is given in Table 3B, whereas the maximum deviation of the freeform surfaces from a best fit asphere for each mirror is given in Tables 3C.

TABLE 3A

| Coefficient | M1 | M2 | M3 | M4 | M5 | M6 |
|---|---|---|---|---|---|---|
| K | −7.735395E+00 | −6.005799E+01 | −3.751432E−01 | −8.758413E−01 | 6.604547E+00 | 8.612526E−02 |
| Y | 0.000000E+00 | 0.000000E+00 | 0.000000E+00 | 0.000000E+00 | 0.000000E+00 | 0.000000E+00 |
| X2 | −1.485069E−04 | −1.263679E−04 | −2.624294E−04 | 1.347923E−05 | −1.388138E−04 | −6.931036E−06 |
| Y2 | −1.726040E−04 | −1.711814E−04 | −1.005287E−03 | −3.665045E−05 | 1.295215E−04 | 8.615161E−06 |
| X2Y | −5.200823E−08 | −4.156617E−07 | 7.669496E−07 | −5.478449E−08 | 9.580682E−07 | −4.043887E−09 |
| Y3 | −3.734392E−08 | −4.637041E−08 | −5.212076E−07 | 4.563436E−08 | 1.158899E−07 | −6.370253E−09 |
| X4 | −1.602036E−10 | 1.080674E−09 | −1.784900E−08 | 3.290440E−10 | 2.227159E−09 | −4.223672E−11 |
| X2Y2 | −5.655636E−10 | 1.150736E−09 | 9.356049E−09 | −1.772824E−10 | 7.086270E−09 | −3.649540E−11 |
| Y4 | 7.840007E−11 | 1.816509E−09 | 1.947612E−09 | 9.043201E−10 | 3.962050E−09 | 5.321857E−12 |
| X4Y | −9.204024E−14 | 2.366905E−12 | −2.677935E−11 | −8.314955E−13 | −1.528996E−11 | 2.788263E−15 |
| X2Y3 | 1.079182E−12 | 3.100338E−12 | 3.708016E−11 | −5.930044E−12 | −2.181691E−11 | −3.366047E−14 |
| Y5 | −4.579479E−13 | −6.879640E−12 | −4.466462E−13 | −4.529833E−13 | −2.295402E−11 | −2.906642E−14 |
| X6 | 6.241273E−17 | −3.829664E−15 | 1.521283E−13 | 1.097127E−15 | −3.501249E−14 | −6.862154E−17 |
| X4Y2 | 1.666766E−15 | 1.243647E−14 | 5.320614E−14 | 7.533431E−16 | 8.652054E−14 | −1.407857E−16 |
| X2Y4 | −2.345440E−15 | 2.162639E−15 | −5.453363E−14 | −1.396841E−14 | 4.036247E−13 | 1.131588E−17 |
| Y6 | −3.012261E−15 | −1.224080E−14 | −1.034267E−14 | 9.519542E−16 | 1.105527E−13 | 3.923271E−17 |
| X6Y | 3.484859E−18 | −9.656525E−18 | −6.882044E−16 | 7.124323E−18 | 8.790794E−16 | 2.032080E−20 |
| X4Y3 | −2.997302E−18 | −1.020453E−16 | −4.147278E−16 | 1.059357E−17 | 9.581262E−16 | −8.784820E−20 |
| X2Y5 | 3.436846E−18 | 2.303857E−17 | −1.104525E−16 | −1.635704E−17 | −1.619074E−15 | −2.001426E−19 |
| Y7 | 1.247042E−17 | 1.643841E−16 | 4.675424E−17 | −7.809506E−19 | −3.824576E−15 | −5.405817E−20 |
| X8 | 6.566049E−22 | 4.616940E−20 | −8.583253E−18 | 1.135128E−21 | −4.651481E−19 | −3.090479E−22 |
| X6Y2 | −1.894284E−20 | −2.084017E−19 | −4.140672E−18 | 3.271179E−20 | −2.096068E−17 | −7.650033E−22 |
| X4Y4 | −4.216883E−21 | −3.239553E−19 | −3.670866E−18 | 4.460462E−20 | −8.776559E−17 | −1.201625E−22 |
| X2Y6 | −2.826171E−21 | −3.920562E−19 | 3.151001E−20 | 7.869294E−21 | −5.615799E−17 | 3.016401E−22 |
| Y8 | −1.315593E−20 | −3.058425E−19 | 2.416437E−20 | 8.284460E−22 | −1.006196E−17 | 1.721317E−22 |
| X8Y | −9.935149E−25 | −5.168771E−24 | −2.316832E−20 | −2.523681E−24 | 1.540486E−20 | −3.155606E−26 |
| X6Y3 | 3.001708E−23 | 1.226818E−21 | −2.812819E−21 | 3.078069E−23 | −1.510545E−19 | −4.150182E−25 |
| X4Y5 | 7.941504E−24 | 1.371322E−21 | −5.440197E−21 | 3.362723E−23 | −6.912241E−19 | −2.930215E−25 |
| X2Y7 | −9.194045E−25 | 7.101398E−22 | 4.152263E−22 | 1.093452E−23 | −4.418575E−19 | 3.377883E−25 |
| Y9 | 0.000000E+00 | 0.000000E+00 | 0.000000E+00 | 0.000000E+00 | 0.000000E+00 | 0.000000E+00 |
| X10 | 0.000000E+00 | 0.000000E+00 | 0.000000E+00 | 0.000000E+00 | 0.000000E+00 | 0.000000E+00 |
| X8Y2 | 0.000000E+00 | 0.000000E+00 | 0.000000E+00 | 0.000000E+00 | 0.000000E+00 | 0.000000E+00 |
| X6Y4 | 0.000000E+00 | 0.000000E+00 | 0.000000E+00 | 0.000000E+00 | 0.000000E+00 | 0.000000E+00 |
| X4Y6 | 0.000000E+00 | 0.000000E+00 | 0.000000E+00 | 0.000000E+00 | 0.000000E+00 | 0.000000E+00 |
| X2Y8 | 0.000000E+00 | 0.000000E+00 | 0.000000E+00 | 0.000000E+00 | 0.000000E+00 | 0.000000E+00 |
| Y10 | 0.000000E+00 | 0.000000E+00 | 0.000000E+00 | 0.000000E+00 | 0.000000E+00 | 0.000000E+00 |
| N radius | 1.00E+00 | 1.00E+00 | 1.00E+00 | 1.00E+00 | 1.00E+00 | 1.00E+00 |
| Y-decenter | −182.329 | −165.907 | 121.386 | 20.437 | 21.141 | 28.282 |
| X-rotation | −10.857 | −0.974 | −13.061 | −5.217 | −2.314 | −0.850 |

In FIG. 3, projection objective 300 is shown in meridional section. The meridional plane is a symmetry plane for projection objective 300. Symmetry about the meridional plane is as the mirrors are decentered only with respect to the y-axis and tilted about the x-axis. Further, the coefficients for the freeform mirrors having an odd degree in the x-coordinate (e.g., $x$, $x^3$, $x^5$, etc.) are zero.

Projection objective 300 is configured for operation with 13.5 nm radiation and has an image-side NA of 0.4 and a tracklength L of 1,498 mm. The optical path length of imaged radiation is 3,931 mm. Accordingly, the ratio of optical path length to tracklength is approximately 2.62. Projection objective has a demagnification of 4×, a maximum distortion of less than 100 nm, a wavefront error WRMS of 0.083λ, and a field

TABLE 3B

| Maximum deviation from best fit sphere [μm]: | |
|---|---|
| Mirror | max. deviation [μm] |
| M1 | 303 |
| M2 | 128 |
| M3 | 244 |
| M4 | 462 |
| M5 | 787 |
| M6 | 401 |

TABLE 3C

Maximum deviation from best fit asphere [μm]:

| Mirror | max. deviation [μm] |
|---|---|
| M1 | 56.8 |
| M2 | 60.1 |
| M3 | 117 |
| M4 | 16.1 |
| M5 | 152 |
| M6 | 382 |

Projection objective 300 images radiation from object plane 103 to an intermediate image at a location 305 near mirror 360. Embodiments that have one or more intermediate images, also include two or more pupil planes. In some embodiments, at least one of these pupil planes is physically accessible for the purposes of placing an aperture stop substantially at that pupil plane. An aperture stop is used to define the size of the projection objective's aperture.

Figure 4:
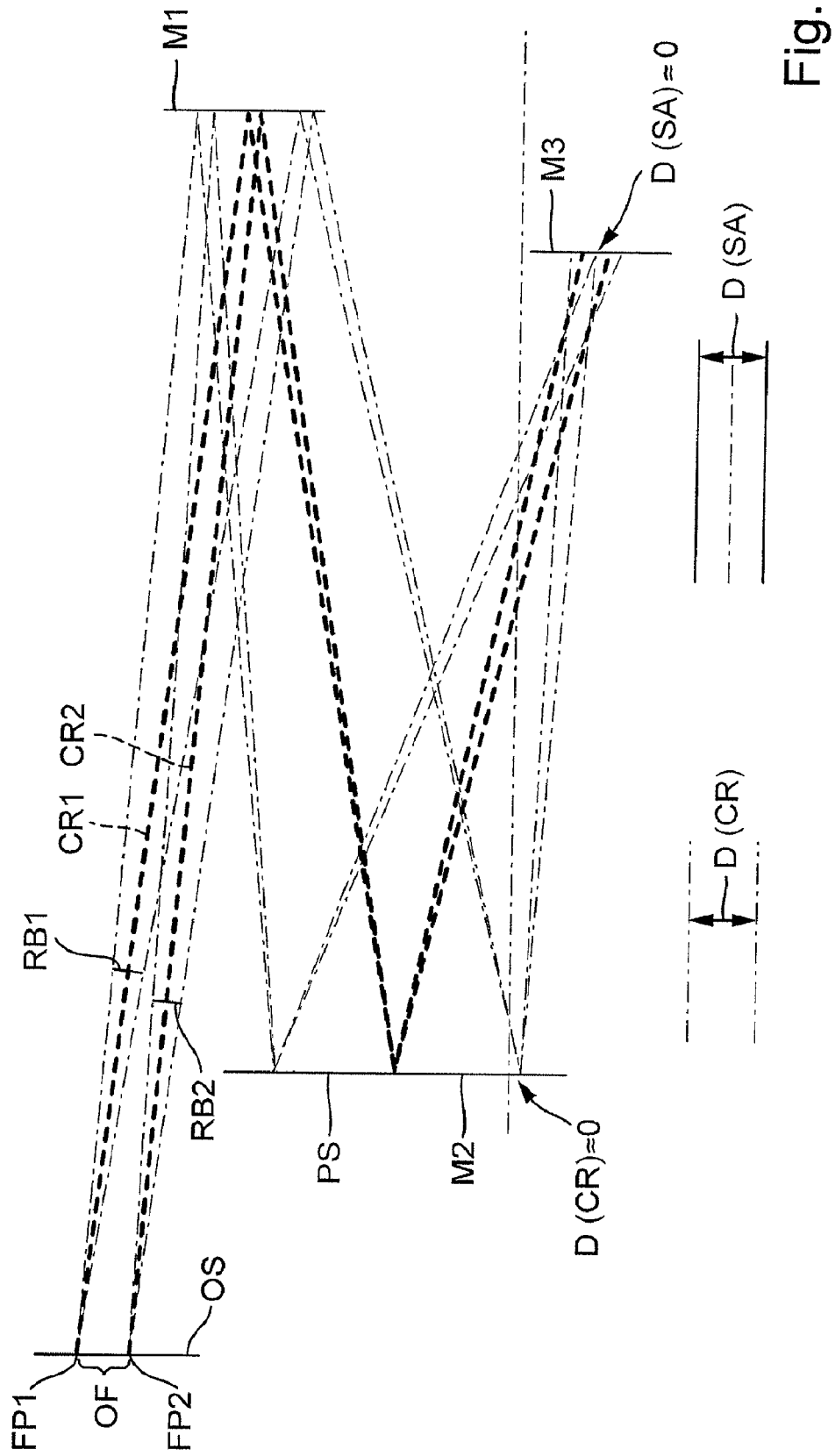
FIG. 4 is a schematic diagram illustrating conditions for mirrors near to a pupil surface and near to a field surface.

Each mirror in projection objective 100 can also be characterized by parameters defining the position of the mirror along the path of radiation in terms of proximity or distance from a field surface or a pupil surface, respectively. Reference is made to schematic FIG. 4 showing three mirrors M1, M2, M3 of a projection objective. Consider a field point FP1 in the object surface OS. A ray bundle RB1 (cone of radiation) having an opening angle proportional to the object-side numerical aperture originates at object field point FP1. As the optical distance from the object surface (corresponding to a field surface) increases, the diameter of such ray bundle increases. Where the ray bundle is incident on an optical surface, the ray bundle may be characterized by a "sub-aperture" of the ray bundle, where the sub-aperture is the area on the optical surface illuminated by the cone of light projected onto the x-y plane. Whereas sub-apertures of different field points FP1 and FP2 laterally offset in the object surface are laterally separated in regions close to the field surface, the sub-apertures of different field points completely overlap in a pupil surface. In a field surface, the diameter D(SA) of a sub-aperture is zero, whereas in a pupil surface the diameters of sub-apertures corresponding to different field points are substantially equal, and the sub-apertures overlap.

Now, consider a meridional section of an effective object field OF in the object surface as shown in FIG. 4. The effective object field includes the plurality of field points actually used for the imaging process. In scanning systems, for example, the effective object field may be rectangular or arcuate with a high aspect ratio between width (in x-direction) and height (measured in the scanning direction, i.e. the y.direction). The diameter of the effective object field in the meridional plane corresponds to a maximum distance of chief rays, D(CR) in the object surface. The chief rays CR1 and CR2 corresponding to field points, FP1 and FP2 are drawn in dashed lines in FIG. 4 (In an optical system essentially telecentric on the object side, the chief rays are nominally orthogonal to the object plane.) As the chief rays propagate through the optical system, the distance D(CR) between the chief rays eventually decreases between a field surface and a subsequent pupil surface. The optical position of a pupil surface PS may be defined as the position where the chief rays CR1 and CR2 intersect. Therefore, the distance between the chief rays, D(CR), approaches zero close to a pupil surface and the condition D(CR)=0 is fulfilled at a pupil surface. Based on these considerations, a parameter $$P(M):=D(SA)/(D(SA)+D(CR))$$

may be defined to characterize the optical proximity or distance of an optical surface M from a field surface or a pupil surface, respectively. Specifically, if the optical surface is positioned exactly in a field surface, D(SA) is =0 such that P(M)=0. On the other hand, if the optical surface M is exactly in a pupil surface, D(CR)=0 such that P(M)=1. In the example of FIG. 3 mirror M2 is positioned close a pupil surface (pupil mirror, D(CR)<<D(SA)), whereas mirror M3 is positioned close to a field surface.

In Table 3D the parameters D(SA), D(CR) and P(M) are given for each of the mirrors in projection objective 300.

TABLE 3D

| Mirror # | D(SA) [mm] | D(CR) [mm] | P(M) |
|---|---|---|---|
| 1 | 145.407 | 13.666 | 0.914 |
| 2 | 117.060 | 6.168 | 0.950 |
| 3 | 61.502 | 4.189 | 0.936 |
| 4 | 104.685 | 14.267 | 0.880 |
| 5 | 81.317 | 1.481 | 0.982 |
| 6 | 377.024 | 1.963 | 0.995 |

In FIG. 3, mirror 350 (M5, geometrically closest to the image surface, P(M)=0.982). is optically close to a pupil surface, therefore, mirror 350 is also denoted as "pupil mirror". Also, mirror 320 (M2), P(M)=0.950 geometrically closest to the object surface is optically close to a pupil surface. In contrast, mirrors 330 (M3) and 340 (M4) (both with P(M) <0.94) are both optically closer to a field surface. Particularly, mirror 330 is a "field mirror" where P(M) is =0.936.

In general, the percentage of radiation at λ reflected by a mirror varies as a function of the angle of incidence of the radiation on the mirror surface. Because imaged radiation propagates through a catoptric projection objective along a number of different paths, the angle of incidence of the radiation on each mirror can vary. This effect is illustrated with reference to FIG. 5, which shows a portion of a mirror 500, in meridional section, that includes a concave reflective surface 501. Imaged radiation is incident on surface 501 along a number of different paths, including the paths shown by rays 510, 520, and 530. Rays 510, 520, and 530 are incident on portions of surface 501 where the surface normal is different. The direction of surface normal at these portions is shown by lines 511, 521, and 531, corresponding to rays 510, 520, and 530, respectively. Rays 510, 520, and 530 are incident on surface 501 at angles $\Theta_{510}$, $\Theta_{520}$, and $\Theta_{530}$, respectively. In general, angles $\Theta_{510}$, $\Theta_{520}$, and $\Theta_{530}$ may vary.

For each mirror in projection objective 101, the incident angles of imaged radiation can be characterized in a variety of ways. One characterization is the maximum angle of incidence, $\Theta_{max}$, for a given location on a mirror (depending on x and y coordinates) of projection objective 101. Another characterization is the minimum angle of incidence, $\Theta_{min}$, for a given location on a mirror of projection objective 101. In general, $\Theta_{max}$ and $\Theta_{min}$ can vary between different locations on a mirror and for different mirrors in projection objective 101.

Each mirror in projection objective 101 can also be characterized by the range of angles of incidence, $\Delta\Theta$, of rays incident on a given location on a mirror surface (angular bandwidth). For each mirror location and each mirror, $\Delta\Theta$ corresponds to the difference between $\Theta_{max}$ and $\Theta_{min}$, In general, $\Delta\Theta$ may vary for each location on a mirror and for each mirror in projection objective 101.

Each mirror in projection objective 100 can also be characterized by the local average angles of incidence, $\Theta_{avg}$, at each location (or point) of the mirror surface averaged over all rays incident on that location. The average angles of incidence may be measured with respect to the normal vector in the local coordinate system of the mirror at each point, where the normal vector is a unit vector perpendicular to the tangent to the mirror surface at each point. Generally, the average angle of incidence will vary across each mirror surface.

Each mirror in projection objective 100 can also be characterized by the maximum average angle of incidence, $\Theta_{avg,max}$, and the minimum average angle of incidence, $\Theta_{avg,min}$, of rays incident of the mirror surface. Generally, $\Theta_{avg,max}$ and $\Theta_{avg,min}$ will vary between the mirror surfaces.

Each mirror surface may be characterized by a value for the variation (or bandwidth) $\Delta\Theta_{avg}$ of the average angle of incidence averaged over all rays incident on a mirror surface. $\Delta\Theta_{avg}$ corresponds to the bandwidth of the average angles of incidence and is calculated here according to $\Delta\Theta_{avg} = \Theta_{avg,max} - \Theta_{avg,min}$.

Table 3E summarizes some of the values mentioned above for all mirrors of projection objective 300. In the last column, Max $\Delta\Theta$ denotes the maximum value of $\Delta\Theta$ ($\Delta\Theta$ is determined for each location on a mirror surface) for each mirror

TABLE 3E

| Mirror | $\Theta_{avg,max}$ [°] | $\Delta\Theta_{avg}$ [°] | Max $\Delta\Theta$ [°] |
|---|---|---|---|
| M1 | 8.47 | 3.52 | 1.57 |
| M2 | 12.73 | 7.42 | 3.27 |
| M3 | 23.86 | 5.54 | 3.92 |
| M4 | 7.55 | 1.38 | 1.91 |
| M5 | 26.77 | 25.32 | 10.59 |
| M6 | 6.81 | 2.94 | 1.25 |

It can be seen that both the maximum value for range of angles of incidence, Max $\Delta\Theta$, and the variation $\Delta\Theta_{avg}$ of the average angles of incidence have the highest values for the pupil mirror 350 (mirror M5). Also, mirror 330 (mirror M3) positioned optically close to a field surface has relatively large values for Max $\Delta\Theta$ and $\Delta\Theta_{avg}$.

Values in the table in bold letters are particularly critical for performance. Note: for M3 $\Delta\theta_{avg}$ seems small compared to e.g. M2, but because of the high angles of incidence (see $\theta_{avg,max}$), and, therefore, the small angular bandwidth of the reflectance curves of the multilayer at these angles, it is in fact a critical value, and should therefore be compensated by a graded coating.

Figure 6:
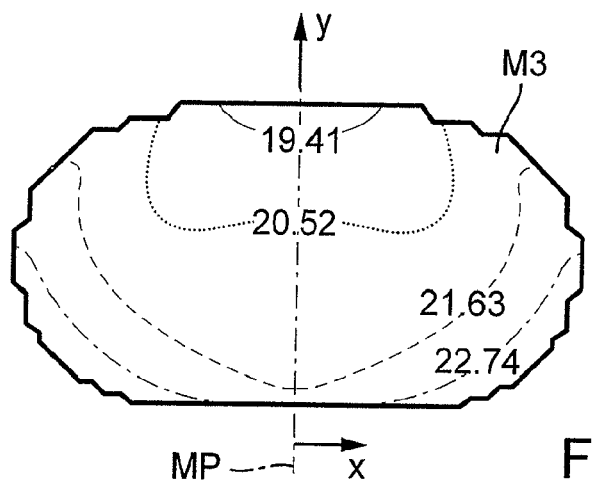
FIG. 6 shows a schematic diagram for the spatial distribution of the average angles of incidence, $\Theta_{avg}$, on mirror M3 in FIG. 3
Figure 7:
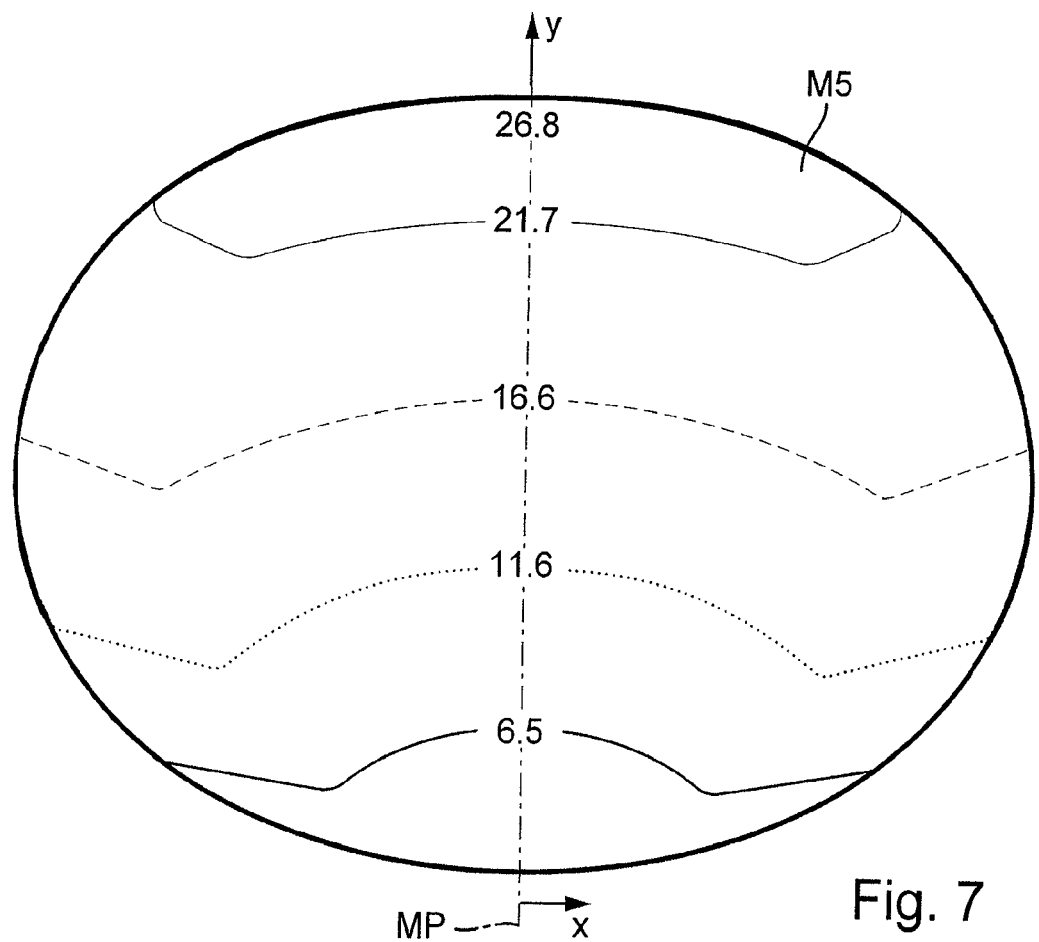
FIG. 7 shows a schematic diagram for the spatial distribution of the average angles of incidence, $\Theta_{avg}$, on mirror M5 in FIG. 3

FIGS. 6 and 7 show in more detail the spatial distribution of the average angle of incidence, $\Theta_{avg}$, on mirror M3 and mirror M5 respectively. In these figures the generally elliptic shapes of the utilized mirror surfaces are shown together with contour lines connecting locations having the same average angles of incidence as indicated for each contour line. It is evident that the distribution of average angles of incidence is symmetric to the meridional plane MP for both mirrors M3 and M5. On the pupil mirror (M5) the lowest values for $\Theta_{avg}$ are obtained at the lower edge ($\Theta_{avg} \approx 6°$), whereas relatively large values are obtained at the upper edge ($\Theta_{avg} = 26.8°$). It is evident that the average angle of incidence, $\Theta_{avg}$, varies substantially in the first direction (y-direction, lying in the meridional plane MP) between the lower edge and the upper edge of the pupil mirror, such that $\Delta\Theta_{avg} > 10°$ or $\Delta\Theta_{avg} > 15°$ or $\Delta\Theta_{avg} > 20°$. On the other hand, there is relatively little variation of the average angle of incidence in the second direction perpendicular to the first direction, i.e. perpendicular to the meridional plane. For example, in the center region of the pupil mirror between upper edge and lower edge, there is a significantly smaller variation of the average angle of incidence in the second direction between the left and right edge of the mirror, where those values vary between about 13° and about 15° such that $\Delta\Theta_{avg} < 5°$ or $\Delta\Theta_{avg} < 3°$, which is generally acceptable at angles of incidence values of about 13° to 15°. Therefore, in a first approximation, the average angle of incidence varies strongly according to a generally linear function in the first direction, whereas the average angle of incidence is essentially constant in the second direction perpendicular thereto.

In contrast, the distribution of average angle of incidence has a different symmetry on the third mirror M3. Specifically, the variation $\Delta\Theta_{avg}$ of the average angle of incidence in the first direction (in the meridional plane) is much smaller than at the pupil mirror, as the average angle of incidence varies only between about 22.5° at the lower edge of the mirror and about 19° at the upper edge of the mirror ($\Delta\Theta_{avg} < 5°$). Unlike the pupil mirror, there is a significant variation of average angle of incidence in the second direction perpendicular to the meridional plane, with a minimum value of about 20.6° in the center of the mirror to about 23° at both lateral edges of the mirror, such that $\Delta\Theta_{avg} > 2°$, which may be a critical value at high angles of incidence >20°, for example.

As will be explained in more detail below, specifically designed graded coatings on those mirror having characteristic variations of average angle of incidence can be employed to minimize the negative effect of incidence angle variation on the reflectivity of the mirrors such that those mirrors show only little variation of reflectivity despite large variations of average angles of incidence across the mirror surface.

Each of the mirrors is coated with a reflective coating including a multilayer stack of layers of different materials. Such multilayer stacks can include about 20 or more, such as about 30 or more, about 40 or more or about 50 or more layers. Multiple alternating layers of molybdenum and silicon can be used to form reflective coatings effective for EUV radiation wavelengths in a range from about 10 nm to about 15 nm, specifically between about 13 nm and 14 nm.

The reflective coatings were optimized for EUV lithography systems operating at 13.5 nm with NA=0.4. Optimization was performed using a coating stack (multilayer stack) as shown in Table 3F.

TABLE 3F

| Material | Thickness [nm] | Function |
|---|---|---|
| ASLayer (n = 0.99946, k = 0.0) | 167.60 | Anti stress layer (no optical function, does not influence reflectivity, because it is to far below the top surface) |
| Si | 3.66 | Bilayer structure for High reflectance multi layer, repeated 46 times. |
| MoSi | 0.8 | |
| Mo | 1.64 | |
| MoSi | 0.8 | |
| Si | 3.66 | Last layer, interface to vacuum. |
| MoSi | 0.8 | |
| Mo | 1.64 | |

Table 3F shows the order of layers of the coating stack from the bottom surface (close to the substrate) to the top surface (in contact with vacuum). Si designates Silicon, while Mo designates Molybdenum. MoSi stands for an interlayer between Molybdenum and Silicon, which in a real coating stack is a result of interdiffusion between the two layers. The interdiffusion layer was introduced to obtain a more physically relevant model. No interface roughness was considered in the calculation. As evident from the table, the multilayer stack includes a bilayer structure of relatively thick Silicon layers and relatively thin Molybdenum layers, which are repeated forty-six times in the multilayer stack. An anti stress layer (ASL) is positioned between the bilayer structure and the substrate. The anti stress layer has no optical function as it is positioned remote from the interface to vacuum. It does not influence reflectivity but improves mechanical stability of the reflective coating.

Optimization was performed by maximizing the overall transmission T of the optical system as retrieved by ray tracing a representative sample of all field points and averaging over all those rays. This approach is similar to averaging over the spatial reflectance distribution of each mirror. The mirrors where optimized separately, that is each one of the mirrors was optimized under the assumption that all other mirrors in the optical system where perfect mirrors with 100% reflectance. The transmission spectrum was optimized for several wavelengths in a band pass from 13.36 nm to 13.64 nm. The wavelengths were weighted according to a predefined source spectrum provided by an illuminator subsystem.

Table 3G presents, for each of the mirrors, the parameters c0, c1y and c2 of equation (2) from which the geometrical layer thicknesses, d(x, y,) of the single layers of the multilayer stack are calculated. Furthermore, the average reflectance $R_{avg}$ [%] and the maximum reflectance $R_{max}$ [%] is given for each of the mirrors. The reflectance value $R_{avg}$ is the average reflectance within the band path from 13.36 to 13.64 nm, obtained by averaging over the whole mirror. Value $R_{max}$ is the maximum reflectance within the same band path.

TABLE 3G

| Mirror | c0 | c1y | c2 | $R_{avg}$ [%] | $R_{max}$ [%] |
|---|---|---|---|---|---|
| M1 | 1.011 | 0.0 | 0.0 | 72.62 | 74.15 |
| M2 | 1.018 | 0.0 | 0.0 | 71.54 | 73.32 |
| M3 | 1.041 | 0.0 | 0.708e−6 | 65.60 | 67.87 |
| M4 | 1.011 | 0.0 | 0.0 | 72.76 | 74.25 |
| M5 | 1.111 | 0.159e−2 | 0.0 | 64.19 | 66.51 |
| M6 | 1.008 | 0.0 | 0.0 | 72.86 | 74.36 |

In view of the fact that coefficient c1y represents a linear term indicating an increase or decrease of layer thickness in the y direction (first direction, in the meridional plane) and parameter c2 represents a parabolic term, it can be seen that mirrors M1, M2, M4 and M6 each have a reflective coating with uniform thickness of all layers. In contrast, mirrors M3 and M5 each have a graded reflective coating having non-uniform layer thickness in the meridional direction. Specifically, mirror M3 positioned optically close to a field surface has a rotationally symmetric graded coating with a parabolic shape. Mirror M5 optically close to a pupil surface (pupil mirror) has a one-dimensionally graded coating where the layer thickness increases linearly along the first direction (in the meridional section) according to coefficient c1y, whereas the layer thickness does not vary along the second direction perpendicular thereto (perpendicular to the drawing plane in FIG. 3).

Figure 8:
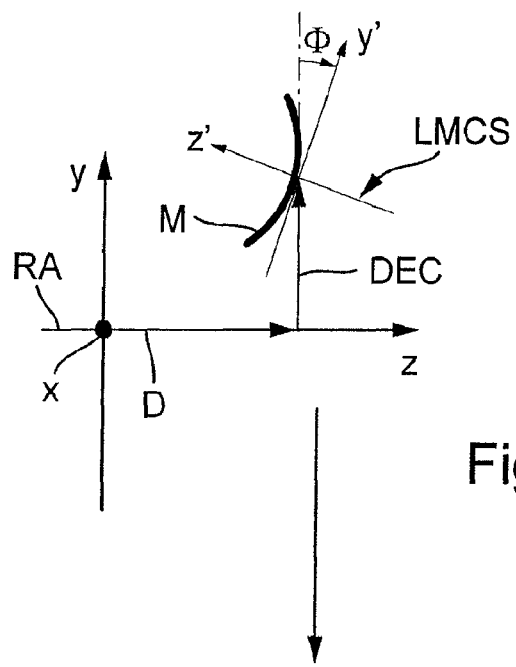
FIG. 8 shows a schematic drawing of a local mirror coordinate system on a mirror.

In FIG. 8 a schematic drawing of a local mirror coordinate system LMCS with axes x', y' and z' on a mirror M is shown. The origin of LMCS is decentered by DEC relative to the reference axis RA in the y-direction and has a distance D from the origin of the coordinate system CS of the optical system along the reference axis.

Figure 9:
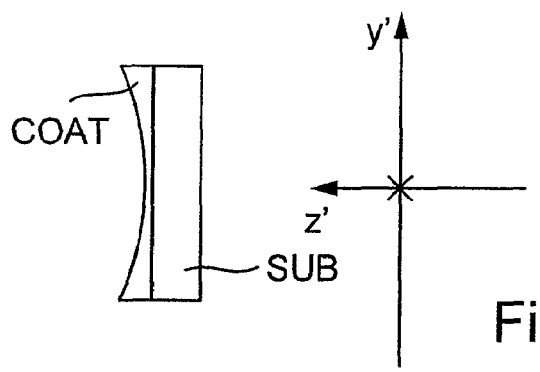
FIG. 9 shows a schematic drawing of a graded reflective coating where the geometrical layer thicknesses of the individual layers of the multilayer stack vary rotationally symmetric around the z' axis according to a parabolic function.

FIG. 9 shows a schematic drawing of a graded reflective coating COAT on a substrate SUB, where the geometrical layer thicknesses of the individual layers of the multilayer stack vary rotationally symmetric around the z' axis according to a parabolic function. Such parabolic coating may, for example, be applied to field mirror M3 and/or field mirror M2.

Figure 10:
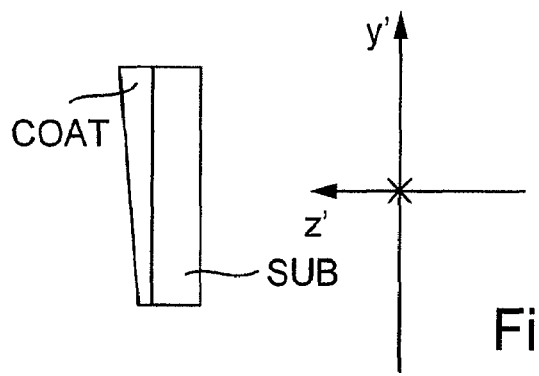
FIG. 10 shows a schematic drawing of a one-dimensionally graded coating according to a linear grading function.

FIG. 10 shows a schematic drawing of a one-dimensionally graded coating COAT according to a linear grading function. An embodiment of such linearly tilted coating is applied to pupil mirror M5.

The total transmission of the optical system of Table 3H is given by the following parameters: $T_{avg}$=11.94% and $T_{max}$=13.67%. In order to demonstrate the benefits possible by using graded coatings instead of uniformly thick coatings on selected mirrors, the following modifications where calculated. The reflectance values of the third mirror M3 provided with a best coating with uniform thickness (c0=1.084) were: $R_{avg}$=64.36% and $R_{max}$=66.78%. This is roughly 1% lower than the corresponding reflectance values when utilizing a graded coating, indicating that a graded coating of appropriate design is beneficial where high average angle of incidence are involved. The reflectance of pupil mirror M5 is greatly improved by using the one-dimensionally graded coating. This is indicated by calculating the reflectance of M5, with the best coating with uniform thickness (c0=1.041), where the following values were obtained: $R_{avg}$=36.47% and $R_{max}$=37.21%. The one-dimensional graded coating is also an improvement with respect to rotationally symmetric graded coating. The reflectance of M5 with the best rotationally symmetric graded coating (c0=1.095 and c2=−1.72×10$^{-5}$) was: $R_{avg}$=50.85% and $R_{max}$=52.69%.

Figure 11:
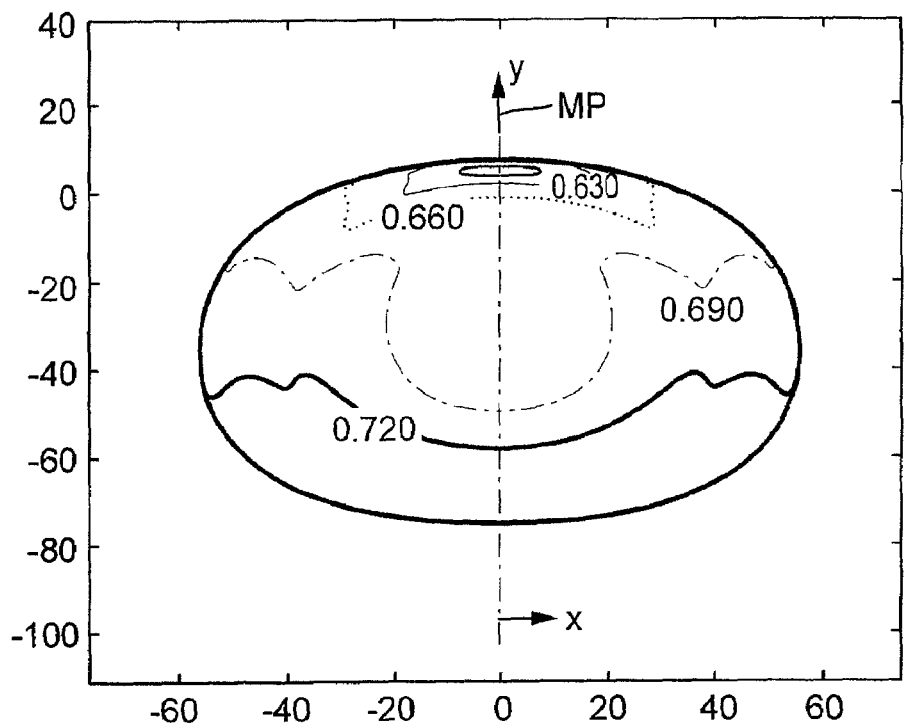
FIG. 11 shows the reflectance of mirror M5 in FIG. 3 at the local average angle of incidence $\theta_{avg}$ for the linearly tilted coating (one-dimensionally graded coating).
Figure 12:
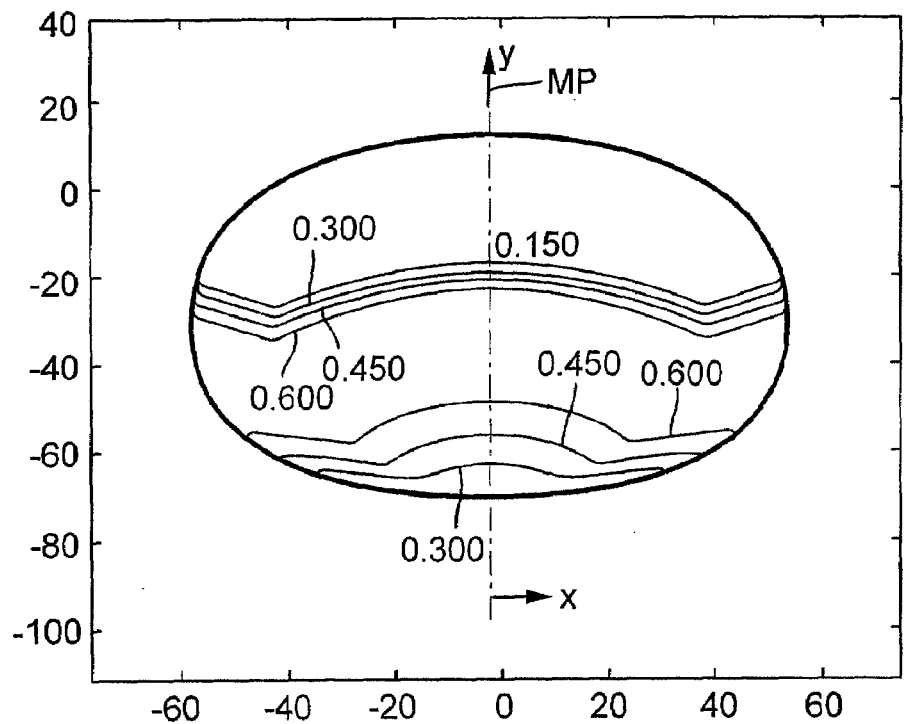
FIG. 12 shows the reflectance of mirror M5 in a reference system at the local average angle of incidence $\theta_{avg}$ for the best constant coating.
Figure 13:
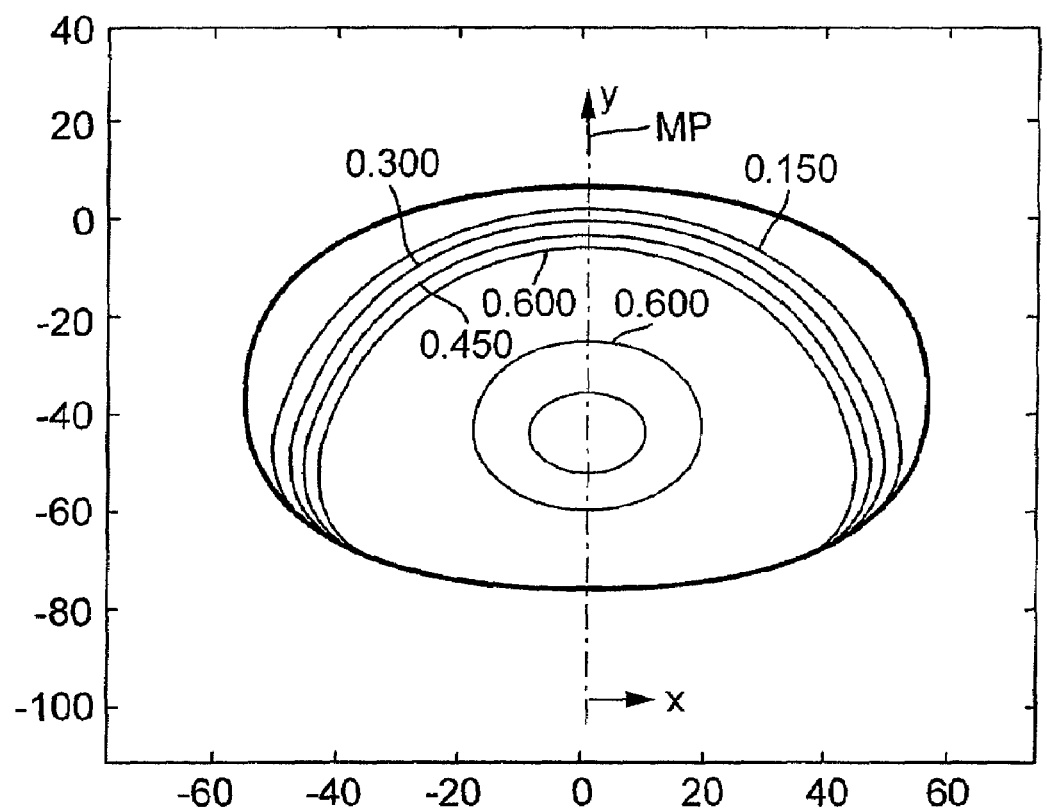
FIG. 13 shows the reflectance of mirror M5 in a reference system at the local average angle of incidence $\theta_{avg}$ for the best parabolic (rotationally symmetric) coating.

Pupil mirror 350 (M5) is the most critical mirror in terms of high angles of incidence, angular bandwidth and variation of the average angle of incidence on the mirror. FIGS. 11 to 13 show the reflectance on the mirror surface of M5 at the local average angle of incidence $\theta_{avg}$ for different types of coatings. FIG. 11 shows the reflectance at the local average angle of incidence $\theta_{avg}$ for the linearly tilted coating (one-dimensionally graded coating). For comparison, FIG. 12 shows the reflectance at the local average angle of incidence $\theta_{avg}$ for the best constant coating and FIG. 13 shows the reflectance at the local average angle of incidence $\theta_{avg}$ for the best parabolic (rotational symmetric) coating. The following table 3H lists the maximum and minimum reflectances at the local average angle of incidence for the three different coating designs for M5 mentioned above. Values are given for a wavelength λ=13.5 nm.

TABLE 3H

| Coating Design | $R_{max}$ [%] | $R_{min}$ [%] | ΔR [%] |
|---|---|---|---|
| Linearly tilted (c0 + c1y) | 74.5 | 58.5 | 16.0 |
| Best constant (c0) | 72.6 | 0.7 | 71.8 |
| Best parabolic (c0 + c2) | 74.6 | 9.1 | 65.5 |

It is obvious that by choosing a linearly tilted coating a large improvement in the homogeneity of the reflectance can be achieved. The first grading function determining the rate of change of thickness of the individual layers (or bilayers) in the y-direction is adapted to the variation of the average angle of incidence and/or the range of angles of incidence in that direction such that pupil mirror M5 has a large absolute reflectance (R>58% for all locations) with little variation (ΔR=$R_{max}$−$R_{min}$=16%) across the entire mirror surface despite the large variation of incidence angles. Specifically, $R_{max}$=74.5% and $R_{min}$=58.5%. Note that, in this context, the notation $R_{max}$ ($R_{min}$) refers to the maximum (minimum) reflectivity on the mirror at the average incidence angle $\theta_{avg}$ and at the simulation wavelength 13.5 nm.

Referring back to FIGS. 6 and 7 showing the spatial distribution of average angles of incidence on mirrors M5 and M3, respectively it is to be noted that these plots are quite instructive to understand why a rotationally symmetric graded coating is more appropriate for mirror M3, while a linearly tilted coating (a one-dimensionally graded coating) is more appropriate for pupil mirror M5. In the case of Mirror M3, the contour lines can be better matched by a rotationally symmetric grading function, while the contour lines of pupil mirror M5 are better matched by a one-dimensional linear function with a constant thickness in the second direction and a linearly changing thickness in the second direction.

Figure 14:
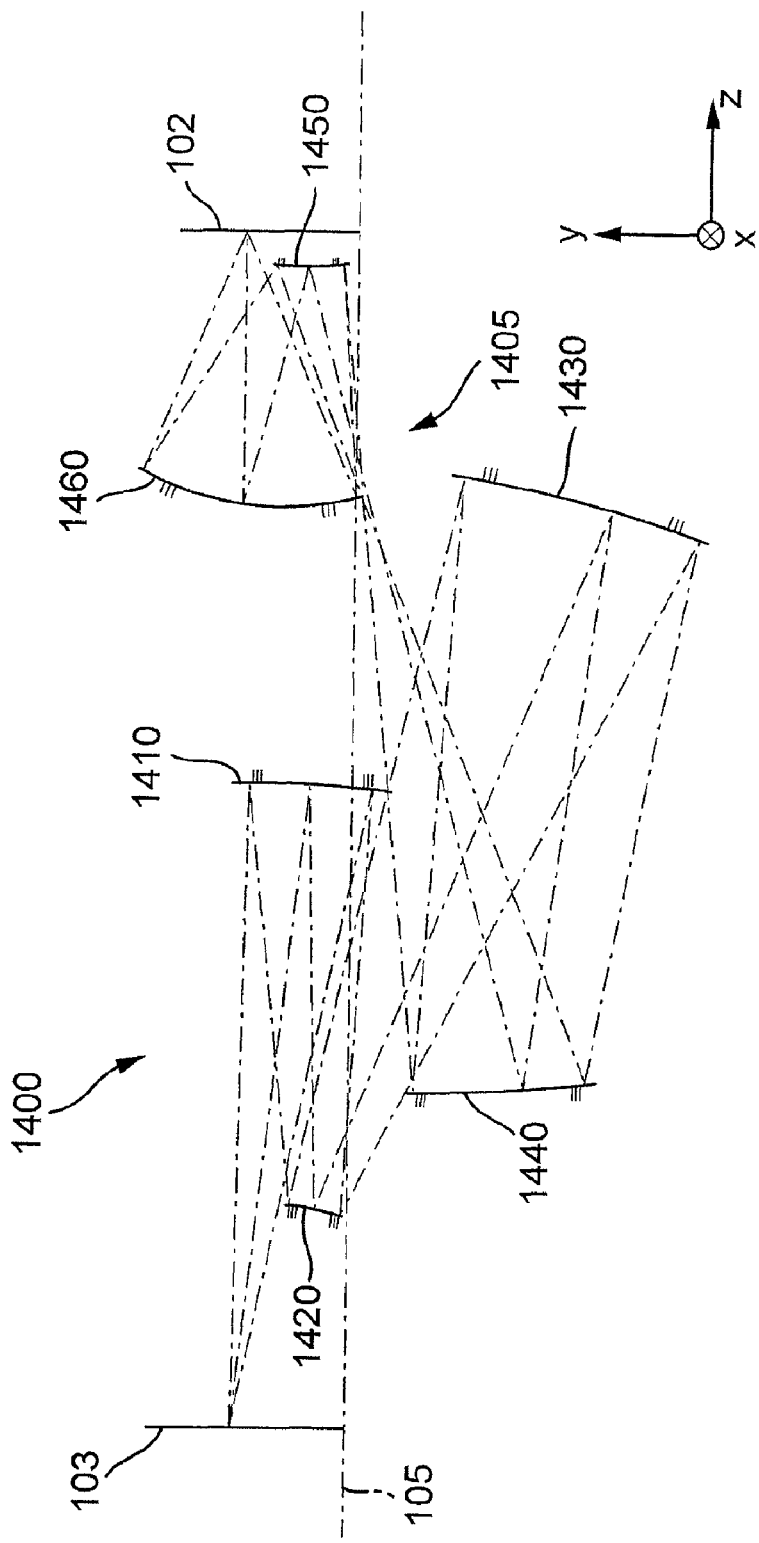
FIG. 14 is a cross-sectional view of a projection objective shown in meridional section.

A projection objective 1400 is shown in FIG. 14. Projection objective 1400 is configured for operation with 13.5 nm radiation and has an image-side NA of 0.4 and a tracklength L of 1,499 mm. The optical path length of imaged radiation is 4762 mm. Accordingly, the ratio of optical path length to tracklength is approximately 3.17. Projection objective has a demagnification of 4×, a maximum distortion of less than 2 nm, a wavefront error WRMS of 40 mλ, and a field curvature of 35 nm.

The first mirror in the radiation path from object plane 103, concave mirror 310, has positive optical power (P mirror). Also, third mirror 1430, fourth mirror 1440, and sixth mirror 1460 each are concave mirrors with positive power. Second mirror 1420 and fifth mirror 1450 are convex mirrors with negative power (N mirror). The sequence of mirrors in the radiation path in projection objective 1400 is thus PNPPNP, as in projection objective 300.

A difference to projection objective 300 is the radiation path between the second and the fifth mirror. Whereas third mirror 330 in FIG. 3 is oriented to reflect radiation coming from second mirror 320 outwardly with respect to reference axis 105 towards fourth mirror 340, in 1400 the third mirror 1430 is oriented to reflect radiation coming from second mirror 1420 inwardly towards the reference axis 1450 onto fourth mirror 1440. As in FIG. 3, the intermediate image location 1405 is close to the inner edge of sixth mirror 1460.

Significant properties of the projection objective are presented in a similar manner as for projection objective 300 explained above. Specifically, table 14 presents optical data, while table 14A presents free form constants for each of the mirror surfaces. Mirror 1 (M1) corresponds to mirror 1410, Mirror 2 (M2) corresponds to mirror 1420 etc. Table 14B represents the maximum deviation from a best fit sphere (in micrometer), and Table 14C represents the maximum deviation from a best fit asphere (in micrometer) for each of the mirrors.

TABLE 14

| Surface | Radius | Thickness | Mode |
|---|---|---|---|
| Object | INFINITY | 793.452 | |
| Mirror 1 | −652.351 | −533.717 | REFL |
| Mirror 2 | −459.234 | 946.263 | REFL |
| Mirror 3 | −1711.458 | −789.999 | REFL |
| Mirror 4 | 1814.404 | 1037.812 | REFL |
| Mirror 5 | 310.131 | −304.837 | REFL |
| Mirror 6 | 407.712 | 349.882 | REFL |
| Image | INFINITY | 0.000 | |

TABLE 14A

| Coefficient | M1 | M2 | M3 | M4 | M5 | M6 |
|---|---|---|---|---|---|---|
| K | −5.917992E−01 | 1.401977E+00 | −1.852312E+00 | 3.134672E+00 | 1.276852E+00 | 2.162747E−01 |
| Y | 0.000000E+00 | 0.000000E+00 | 0.000000E+00 | 0.000000E+00 | 0.000000E+00 | 0.000000E+00 |
| X2 | 2.486175E−04 | 6.462590E−04 | 8.097144E−05 | 3.683589E−05 | −5.694587E−04 | 1.127522E−05 |
| Y2 | 1.796052E−04 | −1.218131E−05 | −3.272168E−05 | −7.479058E−05 | −3.798909E−04 | 5.142215E−05 |
| X2Y | −3.704365E−08 | −3.061838E−06 | 1.166808E−07 | 1.073313E−07 | 3.054784E−06 | −1.901527E−08 |
| Y3 | −8.473076E−09 | −4.336504E−06 | −6.831514E−08 | −2.680850E−08 | 1.944165E−06 | 2.077407E−09 |
| X4 | 1.525482E−11 | 2.440415E−10 | −2.839993E−11 | −8.352784E−11 | 1.477727E−09 | −1.231925E−10 |
| X2Y2 | 4.909383E−11 | 1.819997E−09 | −2.639958E−11 | −7.953809E−11 | 1.884598E−08 | −4.030921E−11 |
| Y4 | 7.241758E−11 | −1.924132E−08 | −1.611187E−10 | −1.805904E−10 | 2.829058E−09 | −6.788132E−11 |
| X4Y | −3.944773E−14 | −3.384346E−12 | 4.634420E−14 | 1.089774E−13 | 4.746215E−11 | 7.092901E−15 |
| X2Y3 | −2.485019E−13 | −1.985647E−10 | −1.749321E−13 | 2.706968E−13 | 1.878106E−10 | 7.623271E−14 |
| Y5 | −6.222758E−14 | 1.546404E−10 | −7.306272E−14 | 1.121470E−13 | 2.713089E−11 | 1.059625E−13 |
| X6 | −2.853060E−17 | 1.499373E−14 | −3.327224E−16 | −3.396117E−16 | 1.122966E−13 | −7.141998E−16 |
| X4Y2 | 5.428060E−17 | −4.560639E−13 | −2.729510E−17 | 1.958645E−17 | 4.975385E−13 | −1.157245E−15 |
| X2Y4 | 9.034205E−16 | 4.633694E−13 | −4.803414E−16 | 4.337124E−16 | 9.650331E−13 | −6.079561E−16 |
| Y6 | 9.726812E−16 | −1.567936E−12 | −9.119915E−16 | 3.224937E−16 | −4.013641E−13 | −1.910957E−16 |
| X6Y | 7.541120E−20 | −5.491590E−16 | −3.248735E−18 | −4.999870E−18 | 1.809992E−15 | 1.533677E−19 |
| X4Y3 | −7.407407E−19 | 1.626025E−15 | −4.175176E−19 | −1.121906E−18 | 4.277794E−15 | 7.709209E−19 |
| X2Y5 | −3.053897E−18 | −1.459850E−15 | −5.190383E−19 | 9.702383E−19 | 5.157566E−15 | 9.414679E−19 |
| Y7 | −1.167661E−17 | 1.377526E−14 | −3.283791E−19 | 9.398678E−20 | −3.053184E−15 | 3.954522E−19 |
| X8 | −1.128385E−22 | −2.091289E−19 | −1.560172E−21 | −2.941200E−21 | 2.054965E−18 | −3.788563E−21 |
| X6Y2 | −2.424101E−21 | −5.485841E−18 | −1.205060E−20 | −3.188366E−20 | 8.911569E−18 | −9.560288E−21 |
| X4Y4 | 4.347588E−22 | −3.722786E−17 | −1.249304E−21 | −8.368608E−21 | 1.007777E−17 | −8.789392E−21 |
| X2Y6 | 2.577199E−21 | −2.687569E−17 | −2.354061E−22 | 8.597809E−22 | 1.143993E−17 | −3.545101E−21 |
| Y8 | 5.215288E−20 | −7.369037E−17 | −4.229309E−23 | −6.689468E−22 | −7.499429E−18 | −1.703637E−21 |
| X8Y | 7.792174E−25 | 0.000000E+00 | −7.813621E−24 | −2.516130E−23 | 0.000000E+00 | 8.396981E−25 |
| X6Y3 | 8.992421E−24 | 0.000000E+00 | −1.921637E−23 | −8.262460E−23 | 0.000000E+00 | 4.664369E−24 |
| X4Y5 | −4.714974E−25 | 0.000000E+00 | −1.610571E−24 | −1.778199E−23 | 0.000000E+00 | 9.398752E−24 |
| X2Y7 | 6.059892E−24 | 0.000000E+00 | 3.848059E−26 | 1.222213E−24 | 0.000000E+00 | 1.042278E−23 |
| Y9 | −8.700880E−23 | 0.000000E+00 | 6.368781E−27 | −2.288415E−25 | 0.000000E+00 | 7.789109E−24 |
| X10 | 0.000000E+00 | 0.000000E+00 | −5.411923E−27 | −1.603639E−26 | 0.000000E+00 | −3.929816E−26 |
| X8Y2 | 0.000000E+00 | 0.000000E+00 | −8.609679E−27 | −4.538477E−26 | 0.000000E+00 | −1.453997E−25 |
| X6Y4 | 0.000000E+00 | 0.000000E+00 | −1.127835E−26 | −7.710579E−26 | 0.000000E+00 | −1.839705E−25 |
| X4Y6 | 0.000000E+00 | 0.000000E+00 | −8.495275E−28 | −1.413945E−26 | 0.000000E+00 | −8.230974E−26 |
| X2Y8 | 0.000000E+00 | 0.000000E+00 | 4.740792E−29 | 1.022008E−27 | 0.000000E+00 | −8.755646E−27 |
| Y10 | 0.000000E+00 | 0.000000E+00 | 1.728076E−29 | 1.964912E−28 | 0.000000E+00 | −7.204080E−27 |
| Nradius | 1.00E+00 | 1.00E+00 | 1.00E+00 | 1.00E+00 | 1.00E+00 | 1.00E+00 |
| Y-decenter | −144.660 | −98.223 | 42.173 | −14.449 | 2.986 | −10.929 |
| X-rotation | −8.868 | −16.235 | 1.500 | −3.658 | −7.600 | −1.635 |

TABLE 14B

Maximum deviation from best fit sphere [μm]:

| Mirror | max. deviation [μm] |
|---|---|
| M1 | 678 |
| M2 | 1820 |
| M3 | 1260 |
| M4 | 1100 |
| M5 | 183 |
| M6 | 577 |

TABLE 14C

Maximum deviation from best fit asphere [μm]:

| Mirror | max. deviation [μm] |
|---|---|
| M1 | 525 |
| M2 | 149 |
| M3 | 164 |
| M4 | 198 |
| M5 | 78.1 |
| M6 | 506 |

Table 14D shows the parameters D(SA), D(CR) and P(M) for each of mirrors in projection objective 1400. Table 14D shows that fifth mirror M5 and sixth mirror M6 as well as second mirror M2 are optically close to a pupil surface, whereas, for example, first mirror M1 and third mirror M3 as well as fourth mirror M4 are optically remote from a pupil surface relatively close to a field surface.

TABLE 14D

| Mirror # | D(SA) [mm] | D(CR) [mm] | P(M) |
|---|---|---|---|
| 1 | 158.908 | 14.272 | 0.918 |
| 2 | 66.079 | 0.571 | 0.991 |
| 3 | 298.593 | 19.695 | 0.938 |
| 4 | 217.162 | 18.157 | 0.923 |
| 5 | 84.864 | 1.244 | 0.986 |
| 6 | 275.025 | 1.984 | 0.993 |

Table 14E summarizes values for the maximum average angle of incidence, $\Theta_{avg,max}$, the variation of the local average angles of incidence, $\Delta\Theta_{avg}$, at each location, and the maximum value for the range of angles of incidence, Max $\Delta\Theta$, of rays (angular bandwidth). As evident from table 14E, both the maximum value of the range of angles of incidence, Max $\Delta\Theta$, and the variation $\Delta\Theta_{avg}$ of the average angle of incidence have the highest value for pupil mirror 1450 (mirror M5). Also, fourth mirror 1440 (M4) optically close to a field surface (field mirror) has relatively high values for the maximum average angle of incidence, $\Theta_{avg,max}$ and the local average angle of incidence, $\Theta_{avg}$.

TABLE 14E

| Mirror | $\Theta_{avg,max}$ [°] | $\Delta\Theta_{avg}$ [°] | Max $\Delta\Theta$ [°] |
|---|---|---|---|
| M1 | 4.79 | 1.0 | 1.85 |
| M2 | 14.61 | 4.43 | 3.75 |
| M3 | 9.21 | 4.84 | 1.38 |
| M4 | 17.02 | 12.20 | 1.61 |
| M5 | 27.25 | 25.46 | 9.44 |
| M6 | 9.88 | 4.43 | 1.78 |

Figure 5:
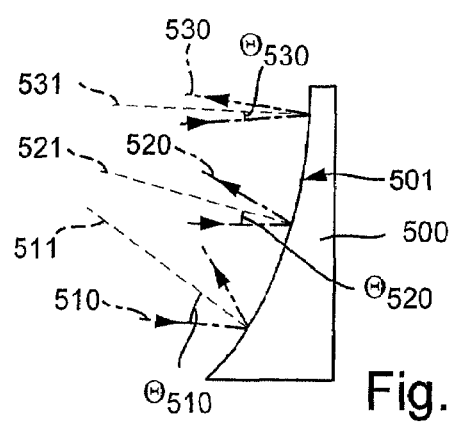
FIG. 5 is a cross-sectional view of a portion of a mirror from a projection objective shown in meridional section.
Figure 15:
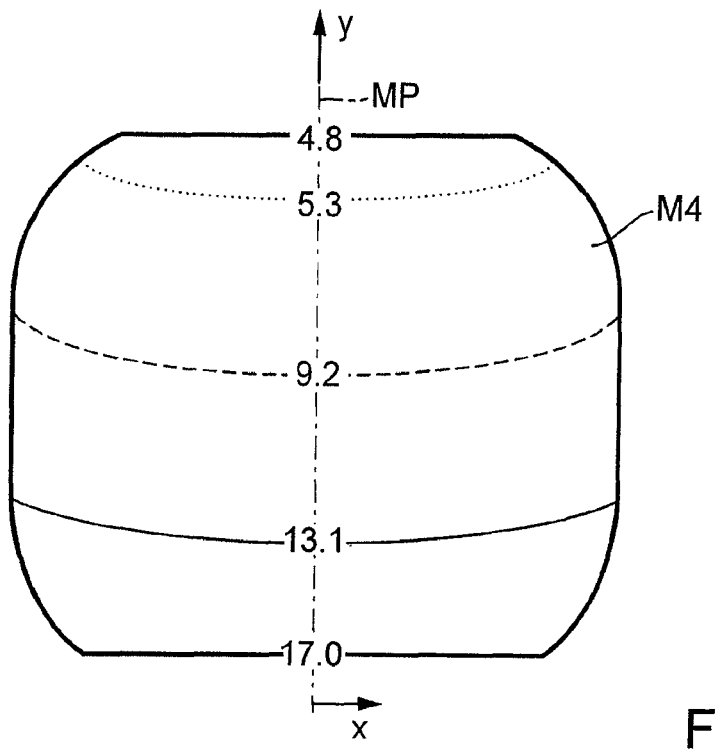
FIG. 15 shows a schematic diagram for the spatial distribution of the average angles of incidence, $\Theta_{avg}$, on mirror M4 in FIG. 14
Figure 16:
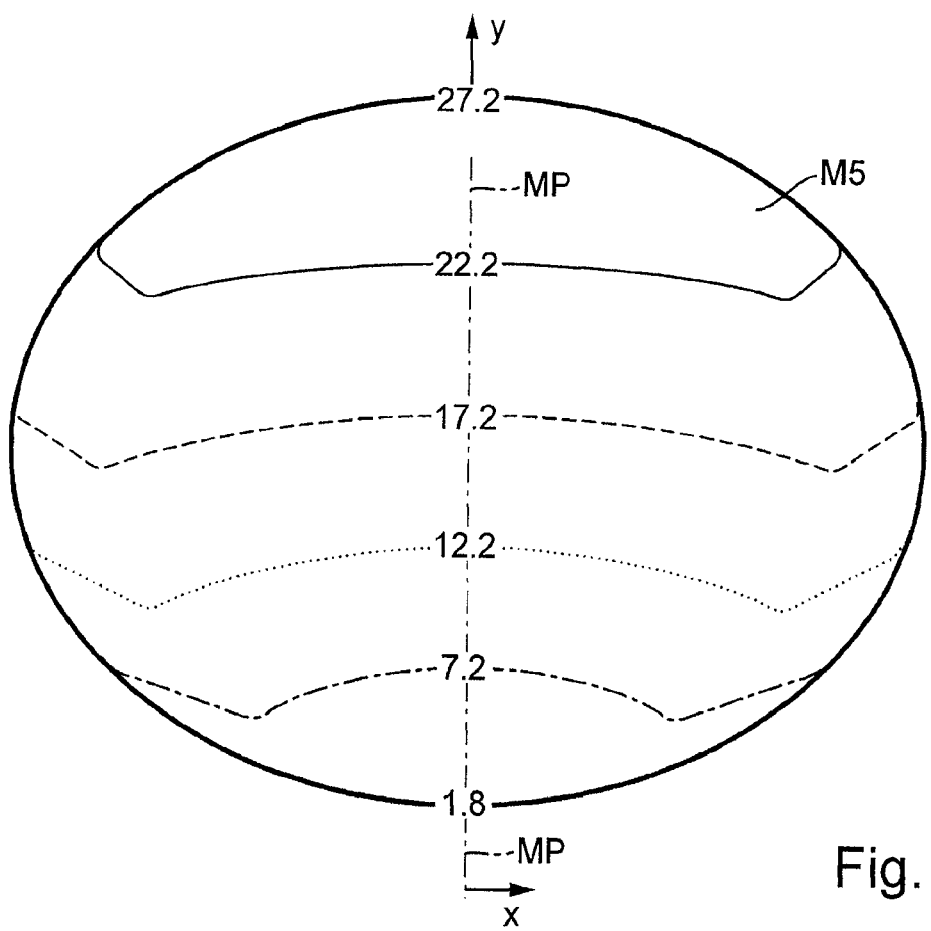
FIG. 16 shows a schematic diagram for the spatial distribution of the average angles of incidence, $\Theta_{avg}$, on mirror M5 in FIG. 14

FIGS. 15 and 16 show in more detail the spatial distribution of the average angle of incidence, $\Theta_{avg}$, on mirror M4 and mirror M5 respectively (compare FIGS. 5, 6). On the pupil mirror (M5) the lowest values for $\Theta_{avg}$ are obtained at the lower edge ($\Theta_{avg}\approx1.8°$), whereas relatively large values are obtained at the upper edge ($\Theta_{avg}=27.2°$). It is evident that the average angle of incidence, $\Theta_{avg}$, varies substantially in the first direction (y-direction, lying in the meridional plane MP) between the lower edge and the upper edge of the pupil mirror, such that $\Delta\Theta_{avg}>20°$. On the other hand, there is relatively little variation of the average angle of incidence in the second direction perpendicular to the first direction, where those values in a central part vary between about 14° and about 17° such that $\Delta\Theta_{avg}<5°$. Therefore, in a first approximation, the average angle of incidence varies strongly according to a generally linear function in the first direction, whereas the average angle of incidence is essentially constant in the second direction perpendicular thereto.

The variation $\Delta\Theta_{avg}$ of the average angle of incidence in the first direction (in the meridional plane) of fourth mirror M4 (FIG. 15) is much smaller than at the pupil mirror, as the average angle of incidence varies only between about 17.0° at the lower edge of the mirror and about 4° at the upper edge of the mirror.

In some embodiments, the coating on fourth mirror M4 is a one-dimensionally graded coating (tilted coating) adapted to the general increase of $\Delta\Theta_{avg}$ between upper edge and lower edge such that the embodiments can have more than one, namely two mirrors out of six mirrors coated with a one-dimensionally graded coating.

Each mirror is coated with a reflective multilayer coating. The order of layers of the coating stack for the calculations is the same as shown in table 3F, which therefore corresponds to table 14 F (not shown). Table 14G presents, for each of the mirrors, the parameters c0, c1y and c2 from equations (1) and (2), as well as the average reflectance $R_{avg}$ [%] and the maximum reflectance $R_{max}$ [%] for each of the mirrors (compare FIG. 3G).

TABLE 14G

| Mirror | c0 | c1y | c2 | $R_{avg}$ [%] | $R_{max}$ [%] |
|---|---|---|---|---|---|
| M1 | 1.006 | 0.0 | 0.0 | 73.07 | 74.54 |
| M2 | 1.031 | 0.0 | 0.0 | 70.68 | 72.51 |
| M3 | 1.013 | 0.0 | 0.0 | 72.49 | 74.04 |
| M4 | 0.992 | 0.0 | 0.34e−6 | 71.64 | 73.20 |
| M5 | 1.155 | 0.168e−2 | 0.0 | 65.57 | 67.87 |
| M6 | 1.015 | 0.0 | 0.0 | 72.21 | 73.82 |

In view of the fact that coefficient c1y represents a linear term indicating an increase or decrease of layer thickness in the y direction (first direction) and parameter c2 represents a parabolic term, it is evident from table 14G that mirrors M1, M2, M3 and M6 each have a reflective coating with uniform thickness of all layers. In contrast, mirrors M4 (a field mirror) and M5 (a pupil mirror) each have a graded reflective coating. Specifically, mirror M4 positioned optically close to a field surface has a rotationally symmetric graded coating with a parabolic shape. Mirror M5 optically close to a pupil surface (pupil mirror) has a one-dimensionally graded coating where the layer thickness increases linearly along the first direction (in the meridional section) according to coefficient c1y, whereas the layer thickness does not vary along the second direction perpendicular thereto (perpendicular to the drawing plane in FIG. 14).

Total transmission of system with this design: $T_{avg}=12.92\%$, $T_{max}=14.75\%$ Reflectance of M4 with best uniform coating (c0=1.032): $R_{avg}=64.95\%$, $R_{max}=68.22\%$. This is due to the large variations of angles of incidence on this mirror. Reflectance of M5 with best flat (uniform) coating (c0=1.041): $R_{avg}$=35.23%, $R_{max}$=35.98%. Reflectance of M5 with best rotationally symmetric coating (c0=1.12, c2=−1.36e−5): $R_{avg}$=57.77%, $R_{max}$=60.36%.

Figure 17:
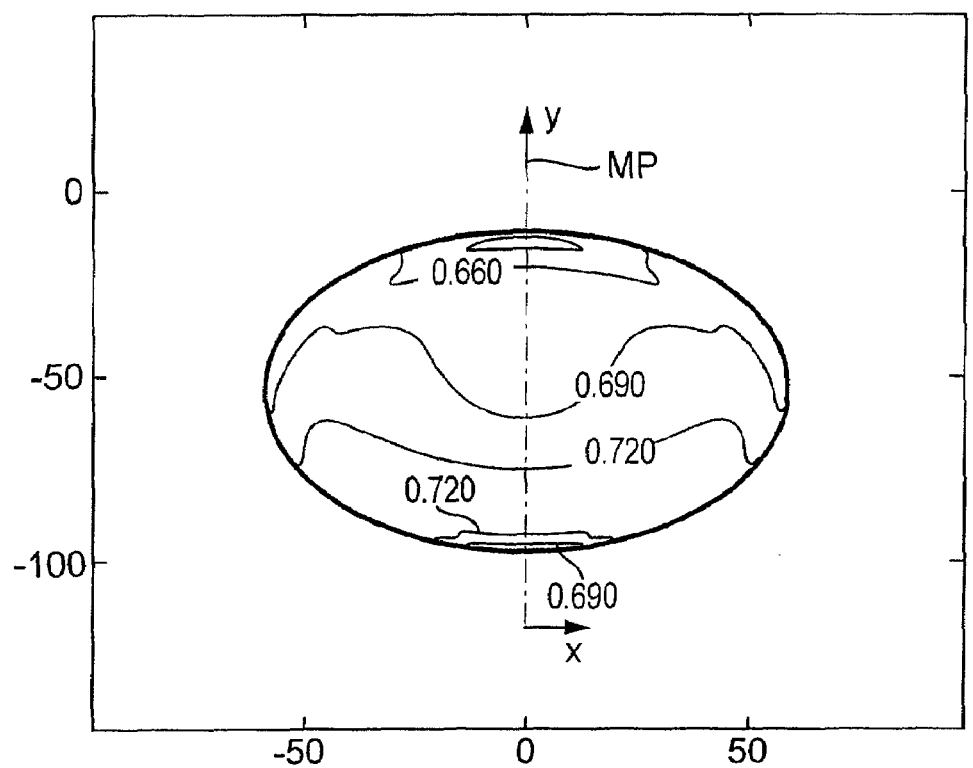
FIG. 17 shows the reflectance of mirror M5 in FIG. 14 at the local average angle of incidence $\theta_{avg}$ for the linearly tilted coating (one-dimensionally graded coating).
Figure 18:
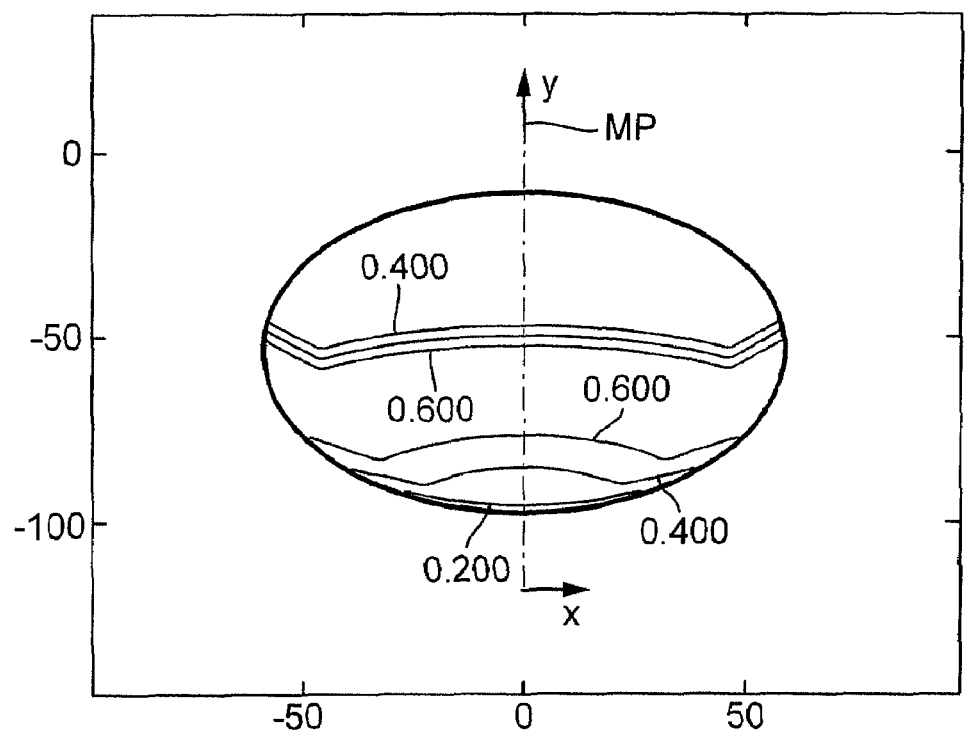
FIG. 18 shows the reflectance of mirror M5 in a reference system at the local average angle of incidence $\theta_{avg}$ for the best constant coating.
Figure 19:
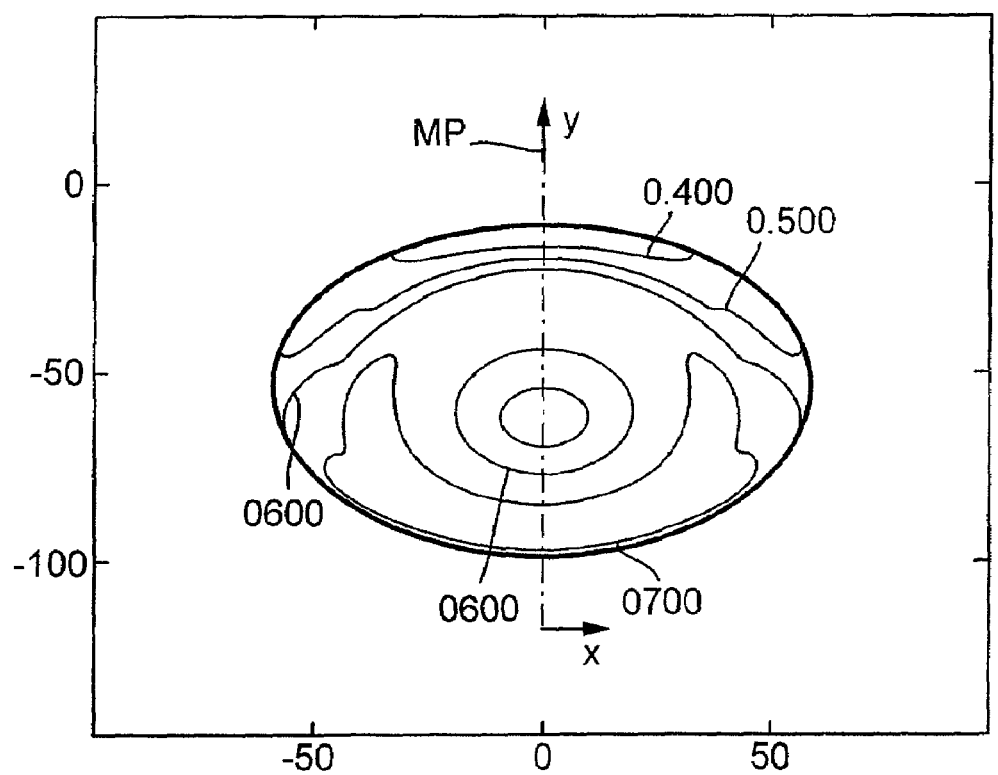
FIG. 19 shows the reflectance of mirror M5 in a reference system at the local average angle of incidence $\theta_{avg}$ for the best parabolic (rotational symmetric) coating.

Pupil mirror 1450 (M5) is the most critical mirror in terms of high angles of incidence, angular bandwidth and variation of the average angle of incidence on the mirror. FIGS. 17 to 19 show the reflectance on the mirror surface of M5 at the local average angle of incidence $\theta_{avg}$ for different types of coatings. FIG. 17 shows the reflectance at the local average angle of incidence $\theta_{avg}$ for the linearly tilted coating (one-dimensionally graded coating). For comparison, FIG. 18 shows the reflectance at the local average angle of incidence $\theta_{avg}$ for the best constant coating (uniform thickness) and FIG. 19 shows the reflectance at the local average angle of incidence $\theta_{avg}$ for the best parabolic (rotational symmetric) coating. Table 14H lists the maximum and minimum reflectances at the local average angle incidence for three different coating designs for mirror M5 at wavelength $\lambda$=13.5 nm (compare explanation in connection with table 3H).

TABLE 14H

| Coating Design | $R_{max}$ [%] | $R_{min}$ [%] | ΔR [%] |
|---|---|---|---|
| Linearly tilted (c0 + c1y) | 74.5 | 61.5 | 13.0 |
| Best constant (c0) | 72.5 | 0.7 | 71.9 |
| Best parabolic (c0 + c2) | 74.5 | 37.4 | 37.2 |

It is obvious that by choosing a linearly tilted coating a large improvement in the homogeneity of the reflectance can be achieved. The first grading function is adapted to the variation of the average angle of incidence and/or the range of angles of incidence in that direction such that pupil mirror M5 has a large absolute reflectance (R>61% for all locations) with little variation ($\Delta R=R_{max}-R_{min}$=13%) across the entire mirror surface despite the large variation of incidence angles. Specifically, $R_{max}$=74.5% and $R_{min}$=61.5%.

Embodiments of optical systems consisting of mirrors only (catoptric systems) may be designed for various wavelength ranges, for example for DUV wavelengths at about 193 nm or less (operating e.g. with an ArF light source). Some embodiments are designed for EUV wavelength 2 nm<$\lambda$<20 nm and/or 10 nm<$\lambda$<15 nm and/or 13 nm<$\lambda$<14 nm. Embodiments capable of use in a microlithograpic projection exposure system are typically designed to provide high resolution such as resolutions less than 1 μm or less than 0.5 μm or less than 100 nm, for example.

The above description has been given by way of example. From the disclosure given, those skilled in the art will not only understand the present disclosure and its attendant advantages, but will also find apparent various changes and modifications to the structures and methods disclosed. It is sought, therefore, to cover all changes and modifications as fall within the spirit and scope of the disclosure, as defined by the appended claims, and equivalents thereof. Other embodiments are in the claims.

What is claimed is:

1. An optical system, comprising:
   a plurality of elements arranged to image radiation at a wavelength $\lambda$ from an object surface to an image surface, the elements including mirror elements, each mirror element having a reflective surface positioned at a path of the radiation, wherein:
   at least one first mirror element of the plurality of mirror elements is a pupil mirror having a pupil mirror surface arranged at or near to a pupil surface of the optical system;
   at least one second mirror element of the plurality of mirror elements is a highly loaded mirror having a mirror surface arranged at a position where at least one of a largest value of a range of angles of incidence and a largest value of an average angle incidence of all remaining mirrors occurs, the at least one second mirror element being different from the at least one first mirror element;
   the pupil mirror surface is formed by a reflective coating designed as a one-dimensionally graded coating including a multilayer stack of layers of different materials, the layers having a geometrical layer thickness which varies according to a first grading function in a first direction of the coating and which is substantially constant in a second direction perpendicular to the first direction; and
   the mirror surface of the highly loaded mirror is coated with a reflective mirror coating designed as a graded coating according to a second grading function.

2. The optical system of claim 1, wherein the position and/or a variation of geometric film thickness of layers of the mirror coating of the highly loaded mirror is adapted to the one-dimensionally graded pupil mirror coating such that non-uniformities of radiation intensity in the image field caused by the one-dimensionally graded pupil mirror coating are at least partly compensated by the graded coating of the highly loaded.

3. The optical system of claim 1, wherein the pupil mirror surface is arranged at a position where the condition P(M) $\geq$0.95 is fulfilled and the mirror surface of the highly loaded mirror is arranged at a position where the condition P(M) <0.95 is fulfilled, wherein $$P(M)=D(SA)/(D(SA)+D(CR)),$$

where D(SA) is a diameter of a subaperture of a ray bundle originating from a field point in the object surface on a respective surface M and D(CR) is a maximum distance of chief rays of an effective object field imaged by the optical system measured in a meridional plane of the optical system.

4. The optical system of claim 1, wherein the highly loaded mirror is a pupil mirror positioned at or close to another optically conjugate pupil surface of the projection objective.

5. The optical system of claim 4, wherein the graded coating of the highly loaded mirror is optimized to compensate at least partially for illumination inhomogeneities caused by the one-dimensionally graded coating of the other pupil mirror.

6. The optical system of claim 1, wherein the plurality of elements define a meridional plane and wherein the first direction is in the meridional plane.

7. The optical system of claim 1, wherein the plurality of elements define a meridional plane and the elements are symmetric with respect to the meridional plane.

8. The optical system of claim 1, wherein a path of radiation through the optical system has an average angle of incidence, $\theta_{avg}$, of rays on each location of a reflective surface, and the first grading function is adapted to the average angle of incidence, $\theta_{avg}$, at the pupil mirror surface such that a local geometrical layer thickness of the layers of the multilayer stack varies substantially proportional to the average angle of incidence, $\theta_{avg}$, in the first direction.

9. The optical system of claim 1, wherein a path of radiation through the optical system has a range of angles of incidence, $\Delta\theta$, of rays on each location of a reflective surface, and the first grading function is adapted to the range of angles of incidence, $\Delta\theta$, at the pupil mirror surface such that a local geometrical layer thickness of the layers of the multilayer stack varies substantially proportional to the range of angles of incidence, $\Delta\theta$, in the first direction.

10. The optical system of claim 1, wherein the first grading function is adapted to a range of angles of incidence, $\Delta\theta$, and/or an average angle of incidence, $\theta_{avg}$, at each location of the pupil mirror surface such that an absolute value of a local reflectivity of the pupil mirror surface in the first direction varies by no more than 30%.

11. The optical system of claim 1, wherein the first grading function is a linear function.

12. The optical system of claim 1, wherein the first grading function is defined such that a local geometrical layer thickness of the layers of the multilayer increases monotonically from one side of the pupil mirror to an opposite side of the pupil mirror along the first direction.

13. The optical system of claim 1, wherein the first grading function is a parabolic function.

14. The optical system of claim 1, wherein the mirror coating of the highly loaded mirror is designed according to a rotationally symmetric second grading function symmetric to a rotation center.

15. The optical system of claim 14, wherein the rotationally symmetric second grading function is a parabolic function.

16. The optical system of claim 1, wherein a local geometrical film thickness $d(x, y)$ of the layers of the multilayer stack deviates by $\lambda/100$ from a grading function according to $$d(x,y)=d0 \cdot \max(0, \text{fac}(x,y)),$$

where $$\text{fac}(x,y)=c0+c1 \cdot y \cdot y+c2 \cdot r(x,y)^2,$$

with $$r(x,y)=\sqrt{x^2+y^2},$$

where y is a coordinate in the first direction, x is a coordinate in the second direction, d0 is a nominal thickness measured in a z direction normal to the reflective surface perpendicular to the x and y direction in a local coordinate system of the reflective surface.

17. The optical system of claim 16, wherein the conditions $0.9 \leq c0 \leq 1.2$ and $c1y \leq 0.1$ and $|c2| \leq 10^{-5}$ hold for a nominal thickness $d0=6.9$ nm.

18. The optical system of claim 1, wherein at least one mirror has a coating with uniform thickness.

19. The optical system of claim 1, wherein all remaining mirrors except for the highly loaded mirror have a coating with uniform thickness.

20. The optical system of claim 1, wherein the optical system is a purely reflective optical system designed for EUV wavelength 13 nm<$\lambda$<14 nm and has an image-side numerical aperture NA of about 0.3 or more.

21. The optical system of claim 1, wherein $0.3 \leq NA \leq 0.4$.

22. The optical system of claim 1, wherein the optical system comprises at least three mirrors and is designed for EUV wavelength 13 nm<$\lambda$<14 nm and has an image-side numerical aperture NA>0.25, where an overall transmission T is 0.08 or more.

23. The optical system of claim 22, wherein $0.3 \leq NA \leq 0.4$.

24. The optical system of claim 1, wherein the optical system has an even number of mirrors.

25. The optical system of claim 24, wherein the optical system has six mirrors.

26. The optical system of claim 1, wherein the optical system comprises three or more mirrors, an average reflectivity $R_{mean}$ integrated over the entire utilized area of the reflective mirror surface being at least 60% on each mirror.

27. The optical system of claim 26, wherein the optical system has an even number of mirrors.

28. The optical system of claim 27, wherein the optical system has six mirrors.

29. The optical system of claim 1, wherein at least one of the elements is a reflective element that has a rotationally asymmetric surface positioned in the path of the radiation, wherein the rotationally asymmetric surface deviates from a best-fit rotationally symmetric surface by about $\lambda$ or more at one or more locations.

30. The optical system of claim 29, wherein the best-fit rotationally asymmetric surface deviates by about $0.1\lambda$ or less from a surface corresponding to the equation:

$$Z = \frac{cr^2}{1+\sqrt{1-(1+k)c^2r^2}} + \sum_{j=2}^{\alpha} C_j X^m Y^n$$

where $$j = \frac{(m+n)^2+m+3n}{2}+1,$$

z is the sag of the surface parallel to an axis, c is the vertex curvature and k is the conical constant, $C_j$ is the coefficient of the monomial $x^m y^n$, and $\lambda$ is an integer.

31. The optical system of claim 30, wherein $\lambda$ is 66.

32. The optical system of claim 30, wherein m consists of even integers.

33. The optical system of claim 30 wherein $m+n \geq 10$.

34. The optical system of claim 29, wherein the rotationally asymmetric surface deviates from the best-fit rotationally symmetric surface by about $10\lambda$ or more at the one or more locations.

35. The optical system of claim 29, wherein at least one of the reflective elements that has a rotationally asymmetric surface has a reflective surface coated with a graded coating.

36. A projection-exposure system, comprising:
an illumination system configured to receive radiation from a primary light source and to illuminate a pattern in an object surface of a projection objective; and
a projection objective,
wherein the project-exposure system is configured to be used in microlithography, and the projection objective comprises an optical system according to claim 1.

37. A projection-exposure system according to claim 36, wherein the primary light source emits EUV radiation at a wavelength 13 nm<$\lambda$<14 nm.

38. A method, comprising:
illuminating a mask having a pattern with radiation having a wavelength $\lambda$; and
using an optical system according to claim 1 to project an image of the pattern onto a photosensitive substrate arranged in the vicinity of the image plane of a projection objective formed.

39. The optical system according to claim 1, configured as a projection objective for microlithography having a resolution of less than 1 µm.

40. An optical system comprising:
a plurality of elements arranged to image radiation at a wavelength $\lambda$ from an object surface to an image surface, the elements including mirror elements having a reflective surface positioned at a path of radiation,
wherein:
at least one of the mirror elements is a pupil mirror having a pupil mirror surface arranged at or near to a pupil surface of the optical system;
the pupil mirror surface is formed by a reflective coating designed as a one-dimensionally graded coating including a multilayer stack of layers of different materials; and
the layers have a geometrical layer thickness which varies according to a first grading function in a first direction of the coating and which is substantially constant in a second direction perpendicular to the first direction.

41. An optical system comprising:
a plurality of elements arranged to image radiation at a wavelength λ from an object surface to an image surface, the elements including mirror elements having a reflective surface positioned at a path of radiation,
wherein:
at least one first mirror element of the plurality of mirror elements is a pupil mirror having a pupil mirror surface arranged at or near to a pupil surface of the optical system;
at least one second mirror element of the plurality of mirror elements being a highly loaded mirror, the at least one second mirror being different from the at least one first mirror element;
the pupil mirror surface is formed by a reflective coating designed as a one-dimensionally graded coating including a multilayer stack of layers of different materials;
the layers have a geometrical layer thickness which varies according to a first grading function in a first direction of the coating and which is substantially constant in a second direction perpendicular to the first direction; and
the mirror surface of the highly loaded mirror is coated with a reflective mirror coating designed as a graded coating according to a second grading function.

42. An optical system comprising:
a plurality of elements arranged to image radiation at a wavelength λ from an object surface to an image surface, the elements including mirror elements having a reflective surface positioned at a path of radiation;
wherein the mirror elements include a mirror element having a maximum value for the range of the angles of incidence, $\Delta\Theta$, in a first direction, this mirror element is coated with a reflective coating designed as a one-dimensionally graded multilayer coating including a multilayer stack of layers of different materials, the layers have a geometrical layer thickness which varies according to a first grading function in a first direction of the coating and which is substantially constant in a second direction perpendicular to the first direction.

43. An optical system comprising:
a plurality of elements arranged to image radiation at a wavelength λ from an object surface to an image surface, the elements including mirror elements having a reflective surface positioned at a path of radiation;
wherein the mirror elements include a mirror element having a maximum value for a variation, $\Delta\Theta_{avg}$, of an average angle of incidence, this mirror element is coated with a reflective coating designed as a one-dimensionally graded multilayer coating including a multilayer stack of layers of different materials, the layers have a geometrical layer thickness which varies according to a first grading function in a first direction of the coating and which is substantially constant in a second direction perpendicular to the first direction.

44. An optical system comprising:
a plurality of elements arranged to image radiation at a wavelength λ from an object surface to an image surface, the elements including mirror elements having a reflective surface positioned at a path of radiation;
where the mirror elements include a first pupil mirror positioned at or close to a first pupil surface and a second pupil mirror positioned at or close to a second pupil surface optically conjugate to the first pupil surface, and the first and second pupil mirror each have a reflective coating designed as a graded coating having a geometrical layer thickness which varies according to a grading function in at least one direction of the mirror coating.

45. An optical system comprising:
a plurality of elements arranged to image radiation at a wavelength λ from an object surface to an image surface, the elements including mirror elements having a reflective surface positioned at a path of radiation;
wherein the optical system includes at least one reflective freeform surface and at least one reflective surface is coated with a graded coating having a geometrical layer thickness which varies according to a grading function in at least one direction of the mirror coating, and
the optical system is a microlithographic projection objective.

46. The optical system according to claim 45, wherein at least one reflective freeform surface is coated with a graded coating.

47. An optical system comprising:
a plurality of elements arranged to image radiation at a wavelength λ from an object surface to an image surface, the elements including a first mirror and a second mirror, wherein:
the optical system has an intermediate image plane between the first and second mirrors along an optical path of the image radiation from the first mirror to the second mirror;
the first mirror is upstream of the intermediate image plane along the optical path;
the first mirror is a pupil mirror;
each of the first and second mirrors has a reflective coating having a geometrical layer thickness which varies in at least one direction of the mirror coating; and
the optical system is a microlithographic projection objective.

48. The optical system of claim 47, wherein the second mirror is a pupil mirror.

* * * * *

UNITED STATES PATENT AND TRADEMARK OFFICE
CERTIFICATE OF CORRECTION

PATENT NO. : 8,194,230 B2
APPLICATION NO. : 11/949376
DATED : June 5, 2012
INVENTOR(S) : Danny Chan and Hans-Juergen Mann It is certified that error appears in the above-identified patent and that said Letters Patent is hereby corrected as shown below:

Title Page, Column 2, Item (57) Abstract, lines 10-11, delete "angle incidence" insert --angle of incidence--;

Column 1, line 51, delete "angle incidence" insert --angle of incidence--;

Column 3, line 60-61, delete "angle incidence" insert --angle of incidence--;

Column 6, line 31-32, delete "direction" insert --direction.--;

Column 7, line 15, delete "$n\lambda=2d\ cos(\Theta_{avg})$," insert --$n\lambda=2dcos(\Theta_{avg})$,--;

Column 8, line 23, delete "then" insert --than--;

Column 9, line 6, delete "decentred" insert --decentered--;

Column 12, line 9, delete "3" insert --3.--;

Column 12, line 12, delete "3" insert --3.--;

Column 12, line 34, delete "14" insert --14.--;

Column 12, line 37, delete "14" insert --14.--;

Column 14, line 54, delete "Table 1 presents optical data," insert --Table 3 presents optical data,--;

Column 15, line 3, delete "V®)" insert --$V^{®}$).--;

Column 17, line 50, delete "y.direction)." insert --y-direction).--;

Signed and Sealed this
Second Day of October, 2012

David J. Kappos
*Director of the United States Patent and Trademark Office*

CERTIFICATE OF CORRECTION (continued)
U.S. Pat. No. 8,194,230 B2

Column 18, line 24, delete "P(M)=0.982)." insert --P(M)=0.982--;

Column 18, line 62, delete "$\Theta_{min}$," insert --$\Theta_{min}$.--;

Column 19, line 21, delete "mirror" insert --mirror.--;

Column 20, line 47, delete "to" insert --too--;

Column 26, line 34-35, delete "(compare FIG. 3G)." insert --(compare Table 3G).--;

Column 27, line 17, delete "angle incidence" insert --angle of incidence--;

Column 27, line 46, delete "microlithograpic" insert --microlithographic--;

Column 28, Claim 1, line 10, delete "angle incidence" insert --angle of incidence--;